US010006973B2

(12) United States Patent
Hahn et al.

(10) Patent No.: US 10,006,973 B2
(45) Date of Patent: *Jun. 26, 2018

(54) MAGNETOMETER WITH A LIGHT EMITTING DIODE

(71) Applicant: Lockheed Martin Corporation, Bethesda, MD (US)

(72) Inventors: Joseph W. Hahn, Erial, NJ (US); Gregory S. Bruce, Abington, PA (US); Wilbur Lew, Mount Laurel, NJ (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/003,292

(22) Filed: Jan. 21, 2016

(65) Prior Publication Data

US 2017/0212179 A1  Jul. 27, 2017

(51) Int. Cl.
*G01R 33/06* (2006.01)
*G01R 33/032* (2006.01)
*G01J 1/08* (2006.01)

(52) U.S. Cl.
CPC .............. *G01R 33/032* (2013.01); *G01J 1/08* (2013.01)

(58) Field of Classification Search
CPC .............. G01R 33/032; G01R 33/0017; G01R 33/0094; G01R 33/46; C01B 32/25; G01C 19/62; G01J 1/0425; G01J 1/08; H03L 7/08; H03L 7/26; H04L 25/0266; H04L 25/05; C30B 29/04; C30B 25/105; A44C 17/00; H01L 21/0405
See application file for complete search history.

(56) References Cited

U.S. PATENT DOCUMENTS

| 2,746,027 A | 5/1956 | Murray |
| 3,359,812 A | 12/1967 | Everitt |
| 3,389,333 A | 6/1968 | Wolff et al. |
| 3,490,032 A | 1/1970 | Zurflueh |
| 3,514,723 A | 5/1970 | Cutler |
| 3,518,531 A | 6/1970 | Huggett |
| 3,745,452 A | 7/1973 | Osburn et al. |

(Continued)

FOREIGN PATENT DOCUMENTS

| CN | 105738845 A | 7/2016 |
| DE | 69608006 T2 | 2/2001 |

(Continued)

OTHER PUBLICATIONS

Fallah et al., "Multi-sensor approach in vessel magnetic wake imaging," Wave Motion 51(1): 60-76 (Jan. 2014), retrieved from http://www.sciencedirect.com/science/article/pii/S0165212513001133 (Aug. 21, 2016), 17 pages.

(Continued)

*Primary Examiner* — Vinh Nguyen
(74) *Attorney, Agent, or Firm* — Foley & Lardner LLP

(57) ABSTRACT

A device includes a diamond with one or more nitrogen vacancies, a light emitting diode configured to emit light that travels through the diamond, and a photo sensor configured to sense the light. The device also includes a processor operatively coupled to the photo sensor. The processor is configured to determine, based on the light sensed by the photo sensor, a magnetic field applied to the diamond.

13 Claims, 6 Drawing Sheets

(56) References Cited

U.S. PATENT DOCUMENTS

| | | |
|---|---|---|
| 3,899,758 A | 8/1975 | Maier et al. |
| 4,025,873 A | 5/1977 | Chilluffo |
| 4,078,247 A | 3/1978 | Albrecht |
| 4,084,215 A | 4/1978 | Willenbrock |
| 4,322,769 A | 3/1982 | Cooper |
| 4,329,173 A | 5/1982 | Culling |
| 4,359,673 A | 11/1982 | Bross et al. |
| 4,368,430 A | 1/1983 | Dale et al. |
| 4,410,926 A | 10/1983 | Hafner et al. |
| 4,437,533 A | 3/1984 | Bierkarre et al. |
| 4,514,083 A | 4/1985 | Fukuoka |
| 4,588,993 A | 5/1986 | Babij et al. |
| 4,636,612 A | 1/1987 | Cullen |
| 4,638,324 A | 1/1987 | Hannan |
| 4,675,522 A | 6/1987 | Arunkumar |
| 4,768,962 A | 9/1988 | Kupfer et al. |
| 4,818,990 A | 4/1989 | Fernandes |
| 4,820,986 A | 4/1989 | Mansfield et al. |
| 4,945,305 A | 7/1990 | Blood |
| 4,958,328 A | 9/1990 | Stubblefield |
| 4,982,158 A | 1/1991 | Nakata et al. |
| 5,019,721 A | 5/1991 | Martens et al. |
| 5,038,103 A | 8/1991 | Scarzello et al. |
| 5,113,136 A | 5/1992 | Hayashi et al. |
| 5,134,369 A | 7/1992 | Lo et al. |
| 5,189,368 A | 2/1993 | Chase |
| 5,200,855 A | 4/1993 | Meredith et al. |
| 5,245,347 A | 9/1993 | Bonta et al. |
| 5,252,912 A | 10/1993 | Merritt et al. |
| 5,301,096 A | 4/1994 | Klontz et al. |
| 5,384,109 A | 1/1995 | Klaveness et al. |
| 5,396,802 A | 3/1995 | Moss |
| 5,420,549 A | 5/1995 | Prestage |
| 5,425,179 A | 6/1995 | Nickel et al. |
| 5,427,915 A | 6/1995 | Ribi et al. |
| 5,548,279 A | 8/1996 | Gaines |
| 5,568,516 A | 10/1996 | Strohallen et al. |
| 5,586,069 A | 12/1996 | Dockser |
| 5,597,762 A | 1/1997 | Popovici et al. |
| 5,638,472 A | 6/1997 | Van Delden |
| 5,694,375 A | 12/1997 | Woodall |
| 5,719,497 A | 2/1998 | Veeser et al. |
| 5,731,996 A | 3/1998 | Gilbert |
| 5,764,061 A | 6/1998 | Asakawa et al. |
| 5,818,352 A | 10/1998 | McClure |
| 5,846,708 A | 12/1998 | Hollis et al. |
| 5,888,925 A | 3/1999 | Smith et al. |
| 5,907,420 A | 5/1999 | Chraplyvy et al. |
| 5,907,907 A | 6/1999 | Ohtomo et al. |
| 5,915,061 A | 6/1999 | Vanoli |
| 6,042,249 A | 3/2000 | Spangenberg |
| 6,057,684 A | 5/2000 | Murakami et al. |
| 6,124,862 A | 9/2000 | Boyken et al. |
| 6,130,753 A | 10/2000 | Hopkins et al. |
| 6,144,204 A | 11/2000 | Sementchenko |
| 6,195,231 B1 | 2/2001 | Sedlmayr et al. |
| 6,215,303 B1 | 4/2001 | Weinstock et al. |
| 6,360,173 B1 | 3/2002 | Fullerton |
| 6,398,155 B1 | 6/2002 | Hepner et al. |
| 6,433,944 B1 | 8/2002 | Nagao et al. |
| 6,472,651 B1 | 10/2002 | Ukai |
| 6,472,869 B1 | 10/2002 | Upschulte et al. |
| 6,504,365 B2 | 1/2003 | Kitamura |
| 6,542,242 B1 | 4/2003 | Yost et al. |
| 6,621,578 B1 | 9/2003 | Mizoguchi |
| 6,636,146 B1 | 10/2003 | Wehoski |
| 6,686,696 B2 | 2/2004 | Mearini et al. |
| 6,690,162 B1 | 2/2004 | Schopohl et al. |
| 6,765,487 B1 | 7/2004 | Holmes et al. |
| 6,788,722 B1 | 9/2004 | Kennedy et al. |
| 6,809,829 B1 | 10/2004 | Takata et al. |
| 7,118,657 B2 | 10/2006 | Golovchenko et al. |
| 7,221,164 B1 | 5/2007 | Barringer |
| 7,277,161 B2 | 10/2007 | Claus |
| 7,305,869 B1 | 12/2007 | Berman et al. |
| 7,307,416 B2 | 12/2007 | Islam et al. |
| RE40,343 E | 5/2008 | Anderson |
| 7,400,142 B2 | 7/2008 | Greelish |
| 7,413,011 B1 | 8/2008 | Chee et al. |
| 7,427,525 B2 | 9/2008 | Santori et al. |
| 7,448,548 B1 | 11/2008 | Compton |
| 7,471,805 B2 | 12/2008 | Goldberg |
| 7,474,090 B2 | 1/2009 | Islam et al. |
| 7,543,780 B1 | 6/2009 | Marshall et al. |
| 7,546,000 B2 | 6/2009 | Spillane et al. |
| 7,570,050 B2 | 8/2009 | Sugiura |
| 7,608,820 B1 | 10/2009 | Berman et al. |
| 7,705,599 B2 | 4/2010 | Strack et al. |
| 7,805,030 B2 | 9/2010 | Bratkovski et al. |
| 7,868,702 B2 | 1/2011 | Ohnishi |
| 7,889,484 B2 | 2/2011 | Choi |
| 7,916,489 B2 | 3/2011 | Okuya |
| 7,983,812 B2 | 7/2011 | Potter |
| 8,022,693 B2 | 9/2011 | Meyersweissflog |
| 8,120,351 B2 | 2/2012 | Rettig et al. |
| 8,120,355 B1 | 2/2012 | Stetson |
| 8,138,756 B2 | 3/2012 | Barclay et al. |
| 8,193,808 B2 | 6/2012 | Fu et al. |
| 8,294,306 B2 | 10/2012 | Kumar et al. |
| 8,310,251 B2 | 11/2012 | Orazem |
| 8,311,767 B1 | 11/2012 | Stetson |
| 8,334,690 B2 | 12/2012 | Kitching et al. |
| 8,415,640 B2 | 4/2013 | Babinec et al. |
| 8,471,137 B2 | 6/2013 | Adair et al. |
| 8,480,653 B2 | 7/2013 | Birchard et al. |
| 8,525,516 B2 | 9/2013 | Le Prado et al. |
| 8,547,090 B2 | 10/2013 | Lukin et al. |
| 8,574,536 B2 | 11/2013 | Boudou et al. |
| 8,575,929 B1 | 11/2013 | Wiegert |
| 8,686,377 B2 | 4/2014 | Twitchen et al. |
| 8,758,509 B2 | 6/2014 | Twitchen et al. |
| 8,803,513 B2 | 8/2014 | Hosek et al. |
| 8,854,839 B2 | 10/2014 | Cheng et al. |
| 8,885,301 B1 | 11/2014 | Heidmann |
| 8,913,900 B2 | 12/2014 | Lukin et al. |
| 8,933,594 B2 | 1/2015 | Kurs |
| 8,947,080 B2 | 2/2015 | Lukin et al. |
| 8,963,488 B2 | 2/2015 | Campanella et al. |
| 9,103,873 B1 | 8/2015 | Martens et al. |
| 9,157,859 B2 | 10/2015 | Walsworth et al. |
| 9,245,551 B2 | 1/2016 | El Hallak et al. |
| 9,249,526 B2 | 2/2016 | Twitchen et al. |
| 9,291,508 B1 | 3/2016 | Biedermann et al. |
| 9,369,182 B2 | 6/2016 | Kurs et al. |
| 9,442,205 B2 | 9/2016 | Geiser et al. |
| 9,541,610 B2 | 1/2017 | Kaup et al. |
| 9,551,763 B1 | 1/2017 | Hahn et al. |
| 9,557,391 B2 | 1/2017 | Egan et al. |
| 9,570,793 B2 | 2/2017 | Borodulin |
| 9,590,601 B2 | 3/2017 | Krause et al. |
| 9,614,589 B1 | 4/2017 | Russo et al. |
| 9,645,223 B2 | 5/2017 | Megdal et al. |
| 9,680,338 B2 | 6/2017 | Malpas et al. |
| 9,689,679 B2* | 6/2017 | Budker ............... G01C 19/58 |
| 9,720,055 B1 | 8/2017 | Hahn et al. |
| 9,778,329 B2 | 10/2017 | Heidmann |
| 2002/0144093 A1 | 10/2002 | Inoue et al. |
| 2002/0167306 A1 | 11/2002 | Zalunardo et al. |
| 2003/0058346 A1 | 3/2003 | Bechtel et al. |
| 2003/0076229 A1 | 4/2003 | Blanpain et al. |
| 2003/0098455 A1 | 5/2003 | Amin et al. |
| 2003/0235136 A1 | 12/2003 | Akselrod et al. |
| 2004/0013180 A1 | 1/2004 | Giannakis et al. |
| 2004/0022179 A1 | 2/2004 | Giannakis et al. |
| 2004/0042150 A1 | 3/2004 | Swinbanks et al. |
| 2004/0081033 A1 | 4/2004 | Arieli et al. |
| 2004/0109328 A1 | 6/2004 | Dahl et al. |
| 2004/0247145 A1 | 12/2004 | Luo et al. |
| 2005/0031840 A1 | 2/2005 | Swift et al. |
| 2005/0068249 A1 | 3/2005 | Frederick Du Toit et al. |
| 2005/0099177 A1 | 5/2005 | Greelish |
| 2005/0112594 A1 | 5/2005 | Grossman |
| 2005/0126905 A1 | 6/2005 | Golovchenko et al. |
| 2005/0130601 A1 | 6/2005 | Palermo et al. |

(56) References Cited

U.S. PATENT DOCUMENTS

| | | |
|---|---|---|
| 2005/0134257 A1 | 6/2005 | Etherington et al. |
| 2005/0138330 A1 | 6/2005 | Owens et al. |
| 2005/0146327 A1 | 7/2005 | Jakab |
| 2006/0012385 A1 | 1/2006 | Tsao et al. |
| 2006/0054789 A1 | 3/2006 | Miyamoto et al. |
| 2006/0055584 A1 | 3/2006 | Waite et al. |
| 2006/0062084 A1 | 3/2006 | Drew |
| 2006/0071709 A1 | 4/2006 | Maloberti et al. |
| 2006/0247847 A1 | 11/2006 | Carter et al. |
| 2006/0255801 A1 | 11/2006 | Ikeda |
| 2006/0291771 A1 | 12/2006 | Braunisch et al. |
| 2007/0004371 A1 | 1/2007 | Okanobu |
| 2007/0247147 A1 | 10/2007 | Xiang et al. |
| 2007/0273877 A1 | 11/2007 | Kawano et al. |
| 2008/0016677 A1 | 1/2008 | Creighton, IV |
| 2008/0048640 A1 | 2/2008 | Hull et al. |
| 2008/0078233 A1 | 4/2008 | Larson et al. |
| 2008/0089367 A1 | 4/2008 | Srinivasan et al. |
| 2008/0204004 A1 | 8/2008 | Anderson |
| 2008/0217516 A1 | 9/2008 | Suzuki et al. |
| 2008/0239265 A1 | 10/2008 | Den Boef |
| 2008/0253264 A1 | 10/2008 | Nagatomi et al. |
| 2008/0266050 A1 | 10/2008 | Crouse et al. |
| 2008/0299904 A1 | 12/2008 | Yi et al. |
| 2009/0015262 A1 | 1/2009 | Strack et al. |
| 2009/0042592 A1 | 2/2009 | Cho et al. |
| 2009/0058697 A1 | 3/2009 | Aas et al. |
| 2009/0060790 A1 | 3/2009 | Okaguchi et al. |
| 2009/0079417 A1 | 3/2009 | Mort et al. |
| 2009/0079426 A1 | 3/2009 | Anderson |
| 2009/0132100 A1 | 5/2009 | Shibata |
| 2009/0157331 A1 | 6/2009 | Van Netten |
| 2009/0161264 A1 | 6/2009 | Meyersweissflog |
| 2009/0195244 A1 | 8/2009 | Mouget et al. |
| 2009/0222208 A1 | 9/2009 | Speck |
| 2009/0277702 A1 | 11/2009 | Kanada et al. |
| 2009/0310650 A1 | 12/2009 | Chester et al. |
| 2010/0004802 A1 | 1/2010 | Bodin et al. |
| 2010/0015438 A1 | 1/2010 | Williams et al. |
| 2010/0015918 A1 | 1/2010 | Liu et al. |
| 2010/0045269 A1 | 2/2010 | Lafranchise et al. |
| 2010/0071904 A1 | 3/2010 | Burns et al. |
| 2010/0102809 A1 | 4/2010 | May |
| 2010/0134922 A1 | 6/2010 | Yamada et al. |
| 2010/0157305 A1 | 6/2010 | Henderson |
| 2010/0188081 A1 | 7/2010 | Lammegger |
| 2010/0237149 A1 | 9/2010 | Olmstead |
| 2010/0271016 A1 | 10/2010 | Barclay et al. |
| 2010/0277121 A1 | 11/2010 | Hall et al. |
| 2010/0308813 A1 | 12/2010 | Lukin et al. |
| 2010/0315079 A1 | 12/2010 | Lukin et al. |
| 2010/0326042 A1 | 12/2010 | McLean et al. |
| 2011/0034393 A1 | 2/2011 | Justen et al. |
| 2011/0059704 A1 | 3/2011 | Norimatsu et al. |
| 2011/0062957 A1 | 3/2011 | Fu et al. |
| 2011/0063957 A1 | 3/2011 | Isshiki et al. |
| 2011/0066379 A1 | 3/2011 | Mes |
| 2011/0120890 A1 | 5/2011 | MacPherson et al. |
| 2011/0127999 A1 | 6/2011 | Lott et al. |
| 2011/0165862 A1 | 7/2011 | Yu et al. |
| 2011/0176563 A1 | 7/2011 | Friel et al. |
| 2011/0243267 A1 | 10/2011 | Won et al. |
| 2011/0270078 A1 | 11/2011 | Wagenaar et al. |
| 2011/0315988 A1 | 12/2011 | Yu et al. |
| 2012/0016538 A1 | 1/2012 | Waite et al. |
| 2012/0019242 A1 | 1/2012 | Hollenberg et al. |
| 2012/0037803 A1 | 2/2012 | Strickland |
| 2012/0044014 A1 | 2/2012 | Stratakos et al. |
| 2012/0051996 A1 | 3/2012 | Scarsbrook et al. |
| 2012/0063505 A1 | 3/2012 | Okamura et al. |
| 2012/0087449 A1 | 4/2012 | Ling et al. |
| 2012/0089299 A1 | 4/2012 | Breed |
| 2012/0140219 A1 | 6/2012 | Cleary |
| 2012/0181020 A1 | 7/2012 | Barron et al. |
| 2012/0194068 A1 | 8/2012 | Cheng et al. |
| 2012/0203086 A1 | 8/2012 | Rorabaugh et al. |
| 2012/0232838 A1 | 9/2012 | Kemppi et al. |
| 2012/0235633 A1 | 9/2012 | Kesler et al. |
| 2012/0235634 A1 | 9/2012 | Hall et al. |
| 2012/0245885 A1 | 9/2012 | Kimishima |
| 2012/0257683 A1 | 10/2012 | Schwager et al. |
| 2012/0281843 A1 | 11/2012 | Christensen et al. |
| 2012/0326793 A1 | 12/2012 | Gan |
| 2013/0043863 A1 | 2/2013 | Ausserlechner et al. |
| 2013/0093424 A1 | 4/2013 | Blank et al. |
| 2013/0127518 A1 | 5/2013 | Nakao |
| 2013/0179074 A1 | 7/2013 | Haverinen |
| 2013/0215712 A1 | 8/2013 | Geiser et al. |
| 2013/0223805 A1 | 8/2013 | Ouyang et al. |
| 2013/0265042 A1 | 10/2013 | Kawabata et al. |
| 2013/0265782 A1 | 10/2013 | Barrena et al. |
| 2013/0270991 A1 | 10/2013 | Twitchen et al. |
| 2013/0279319 A1 | 10/2013 | Matozaki et al. |
| 2014/0012505 A1 | 1/2014 | Smith et al. |
| 2014/0037932 A1 | 2/2014 | Twitchen et al. |
| 2014/0044208 A1 | 2/2014 | Woodsum |
| 2014/0061510 A1 | 3/2014 | Twitchen et al. |
| 2014/0070622 A1 | 3/2014 | Keeling et al. |
| 2014/0072008 A1 | 3/2014 | Faraon et al. |
| 2014/0077231 A1 | 3/2014 | Twitchen et al. |
| 2014/0081592 A1 | 3/2014 | Bellusci et al. |
| 2014/0104008 A1 | 4/2014 | Gan |
| 2014/0126334 A1 | 5/2014 | Megdal et al. |
| 2014/0139322 A1 | 5/2014 | Wang et al. |
| 2014/0154792 A1 | 6/2014 | Moynihan et al. |
| 2014/0159652 A1 | 6/2014 | Hall et al. |
| 2014/0166904 A1 | 6/2014 | Walsworth et al. |
| 2014/0167759 A1 | 6/2014 | Pines et al. |
| 2014/0168174 A1 | 6/2014 | Idzik et al. |
| 2014/0180627 A1 | 6/2014 | Naguib et al. |
| 2014/0191139 A1 | 7/2014 | Englund |
| 2014/0191752 A1 | 7/2014 | Walsworth et al. |
| 2014/0198463 A1 | 7/2014 | Klein |
| 2014/0210473 A1 | 7/2014 | Campbell et al. |
| 2014/0215985 A1 | 8/2014 | Pollklas |
| 2014/0225606 A1 | 8/2014 | Endo et al. |
| 2014/0247094 A1 | 9/2014 | Englund et al. |
| 2014/0265555 A1 | 9/2014 | Hall et al. |
| 2014/0272119 A1 | 9/2014 | Kushalappa et al. |
| 2014/0273826 A1 | 9/2014 | Want et al. |
| 2014/0291490 A1 | 10/2014 | Hanson et al. |
| 2014/0297067 A1 | 10/2014 | Malay |
| 2014/0306707 A1 | 10/2014 | Walsworth et al. |
| 2014/0327439 A1 | 11/2014 | Cappellaro et al. |
| 2014/0335339 A1 | 11/2014 | Dhillon et al. |
| 2014/0340085 A1 | 11/2014 | Cappellaro et al. |
| 2014/0368191 A1 | 12/2014 | Goroshevskiy et al. |
| 2015/0001422 A1 | 1/2015 | Englund et al. |
| 2015/0009746 A1 | 1/2015 | Kucsko et al. |
| 2015/0018018 A1 | 1/2015 | Shen et al. |
| 2015/0022404 A1 | 1/2015 | Chen et al. |
| 2015/0048822 A1 | 2/2015 | Walsworth et al. |
| 2015/0054355 A1 | 2/2015 | Ben-Shalom et al. |
| 2015/0061590 A1 | 3/2015 | Widmer et al. |
| 2015/0090033 A1 | 4/2015 | Budker et al. |
| 2015/0128431 A1 | 5/2015 | Kuo |
| 2015/0137793 A1 | 5/2015 | Englund et al. |
| 2015/0153151 A1 | 6/2015 | Kochanski |
| 2015/0192532 A1 | 7/2015 | Clevenson et al. |
| 2015/0192596 A1 | 7/2015 | Englund et al. |
| 2015/0225052 A1 | 8/2015 | Cordell |
| 2015/0235661 A1 | 8/2015 | Heidmann |
| 2015/0253355 A1 | 9/2015 | Grinolds et al. |
| 2015/0268373 A1 | 9/2015 | Meyer |
| 2015/0269957 A1 | 9/2015 | El Hallak et al. |
| 2015/0276897 A1 | 10/2015 | Leussler et al. |
| 2015/0288352 A1 | 10/2015 | Krause et al. |
| 2015/0299894 A1 | 10/2015 | Markham et al. |
| 2015/0303333 A1 | 10/2015 | Yu et al. |
| 2015/0314870 A1 | 11/2015 | Davies |
| 2015/0326030 A1 | 11/2015 | Malpas et al. |
| 2015/0326410 A1 | 11/2015 | Krause et al. |
| 2015/0374250 A1 | 12/2015 | Hatano et al. |
| 2015/0377865 A1 | 12/2015 | Acosta et al. |

(56) References Cited

U.S. PATENT DOCUMENTS

| | | |
|---|---|---|
| 2015/0377987 A1 | 12/2015 | Menon et al. |
| 2016/0031339 A1 | 2/2016 | Geo |
| 2016/0036529 A1 | 2/2016 | Griffith et al. |
| 2016/0052789 A1 | 2/2016 | Gaathon et al. |
| 2016/0071532 A9 | 3/2016 | Heidmann |
| 2016/0077167 A1 | 3/2016 | Heidmann |
| 2016/0097702 A1 | 4/2016 | Zhao et al. |
| 2016/0113507 A1 | 4/2016 | Reza et al. |
| 2016/0139048 A1* | 5/2016 | Heidmann ............ G01N 21/63 250/459.1 |
| 2016/0146904 A1 | 5/2016 | Stetson et al. |
| 2016/0161429 A1 | 6/2016 | Englund et al. |
| 2016/0214714 A1 | 7/2016 | Sekelsky |
| 2016/0216304 A1 | 7/2016 | Sekelsky |
| 2016/0216340 A1 | 7/2016 | Egan et al. |
| 2016/0216341 A1 | 7/2016 | Boesch et al. |
| 2016/0221441 A1 | 8/2016 | Hall et al. |
| 2016/0223621 A1 | 8/2016 | Kaup et al. |
| 2016/0231394 A1 | 8/2016 | Manickam et al. |
| 2016/0266220 A1 | 9/2016 | Sushkov et al. |
| 2016/0282427 A1 | 9/2016 | Heidmann |
| 2016/0291191 A1 | 10/2016 | Fukushima et al. |
| 2016/0313408 A1 | 10/2016 | Hatano et al. |
| 2016/0348277 A1 | 12/2016 | Markham et al. |
| 2016/0356863 A1 | 12/2016 | Boesch et al. |
| 2017/0010214 A1 | 1/2017 | Osawa et al. |
| 2017/0010334 A1 | 1/2017 | Krause et al. |
| 2017/0010338 A1 | 1/2017 | Bayat et al. |
| 2017/0010594 A1 | 1/2017 | Kottapalli et al. |
| 2017/0023487 A1 | 1/2017 | Boesch |
| 2017/0038314 A1 | 2/2017 | Suyama et al. |
| 2017/0068012 A1 | 3/2017 | Fisk |
| 2017/0074660 A1 | 3/2017 | Gann et al. |
| 2017/0075020 A1 | 3/2017 | Gann et al. |
| 2017/0104426 A1 | 4/2017 | Mills |
| 2017/0138735 A1 | 5/2017 | Cappellaro et al. |
| 2017/0199156 A1 | 7/2017 | Villani et al. |
| 2017/0205526 A1 | 7/2017 | Meyer |
| 2017/0207823 A1 | 7/2017 | Russo et al. |
| 2017/0211947 A1 | 7/2017 | Fisk |
| 2017/0212046 A1 | 7/2017 | Cammerata |
| 2017/0212177 A1 | 7/2017 | Coar et al. |
| 2017/0212178 A1 | 7/2017 | Hahn et al. |
| 2017/0212179 A1 | 7/2017 | Hahn et al. |
| 2017/0212180 A1 | 7/2017 | Hahn et al. |
| 2017/0212181 A1 | 7/2017 | Coar et al. |
| 2017/0212182 A1 | 7/2017 | Hahn et al. |
| 2017/0212183 A1 | 7/2017 | Egan et al. |
| 2017/0212184 A1 | 7/2017 | Coar et al. |
| 2017/0212185 A1 | 7/2017 | Hahn et al. |
| 2017/0212186 A1 | 7/2017 | Hahn et al. |
| 2017/0212187 A1 | 7/2017 | Hahn et al. |
| 2017/0212190 A1 | 7/2017 | Reynolds et al. |
| 2017/0212258 A1 | 7/2017 | Fisk |

FOREIGN PATENT DOCUMENTS

| | | |
|---|---|---|
| DE | 19600241 C2 | 8/2002 |
| DE | 10228536 A1 | 1/2003 |
| EP | 0 161 940 B1 | 12/1990 |
| EP | 0 718 642 | 6/1996 |
| EP | 0 726 458 | 8/1996 |
| EP | 1 505 627 | 2/2005 |
| EP | 1 685 597 | 8/2006 |
| EP | 1 990 313 | 11/2008 |
| EP | 2 163 392 | 3/2010 |
| EP | 2 495 166 A1 | 9/2012 |
| EP | 2 587 232 A1 | 5/2013 |
| EP | 2 705 179 | 3/2014 |
| EP | 2 707 523 | 3/2014 |
| EP | 2 745 360 | 6/2014 |
| EP | 2 769 417 | 8/2014 |
| EP | 2 790 031 | 10/2014 |
| EP | 2 837 930 | 2/2015 |
| EP | 2 907 792 | 8/2015 |
| GB | 2 433 737 | 7/2007 |
| GB | 2423366 A | 8/2008 |
| GB | 2 482 596 | 2/2012 |
| GB | 2 483 767 | 3/2012 |
| GB | 2 486 794 | 6/2012 |
| GB | 2 490 589 | 11/2012 |
| GB | 2 491 936 | 12/2012 |
| GB | 2 493 236 | 1/2013 |
| GB | 2 495 632 A | 4/2013 |
| GB | 2 497 660 | 6/2013 |
| GB | 2 510 053 A | 7/2014 |
| GB | 2 515 226 | 12/2014 |
| GB | 2 522 309 | 7/2015 |
| GB | 2 526 639 | 12/2015 |
| JP | 3782147 B2 | 6/2006 |
| JP | 4800896 B2 | 10/2011 |
| JP | 2012-103171 | 5/2012 |
| JP | 2012-110489 | 6/2012 |
| JP | 2012-121748 | 6/2012 |
| JP | 2013-028497 | 2/2013 |
| JP | 5476206 B2 | 4/2014 |
| JP | 5522606 B2 | 6/2014 |
| JP | 5536056 B2 | 7/2014 |
| JP | 5601183 B2 | 10/2014 |
| JP | 2014-215985 | 11/2014 |
| JP | 2014-216596 | 11/2014 |
| JP | 2015-518562 A | 7/2015 |
| JP | 5764059 B2 | 8/2015 |
| JP | 2015-167176 | 9/2015 |
| JP | 2015-529328 | 10/2015 |
| JP | 5828036 B2 | 12/2015 |
| JP | 5831947 B2 | 12/2015 |
| WO | WO-87/04028 A1 | 7/1987 |
| WO | WO-88/04032 A1 | 6/1988 |
| WO | WO-95/33972 A1 | 12/1995 |
| WO | WO-2011/046403 A2 | 4/2011 |
| WO | WO-2011/153339 | 12/2011 |
| WO | WO-2012/016977 A2 | 2/2012 |
| WO | WO-2012/084750 | 6/2012 |
| WO | WO-2013/059404 A1 | 4/2013 |
| WO | WO-2013/066446 A1 | 5/2013 |
| WO | WO-2013/066448 | 5/2013 |
| WO | WO-2013/093136 A1 | 6/2013 |
| WO | WO-2013/188732 A1 | 12/2013 |
| WO | WO-2013/190329 A1 | 12/2013 |
| WO | WO-2014/011286 A2 | 1/2014 |
| WO | WO-2014/099110 A2 | 6/2014 |
| WO | WO-2014/135544 A1 | 9/2014 |
| WO | WO-2014/135547 A1 | 9/2014 |
| WO | WO-2014/166883 A1 | 10/2014 |
| WO | WO-2014/210486 A1 | 12/2014 |
| WO | WO-2015/015172 A1 | 2/2015 |
| WO | WO-2015/142945 | 9/2015 |
| WO | WO-2015/157110 | 10/2015 |
| WO | WO-2015/157290 | 10/2015 |
| WO | WO-2015/158383 A1 | 10/2015 |
| WO | WO-2015/193156 A1 | 12/2015 |
| WO | WO-2016/075226 A1 | 5/2016 |
| WO | WO-2016/118756 | 7/2016 |
| WO | WO-2016/118791 | 7/2016 |
| WO | WO-2016/122965 | 8/2016 |
| WO | WO-2016/122966 | 8/2016 |
| WO | WO-2016/126435 | 8/2016 |
| WO | WO-2016/126436 | 8/2016 |
| WO | WO-2016/190909 | 12/2016 |
| WO | WO-2017/007513 | 1/2017 |
| WO | WO-2017/007514 | 1/2017 |
| WO | WO-2017/014807 | 1/2017 |
| WO | PCT/US2017/021593 | 3/2017 |
| WO | PCT/US2017/021811 | 3/2017 |
| WO | PCT/US2017/022118 | 3/2017 |
| WO | PCT/US2017/022279 | 3/2017 |
| WO | PCT/US2017/024165 | 3/2017 |
| WO | PCT/US2017/024167 | 3/2017 |
| WO | PCT/US2017/024168 | 3/2017 |
| WO | PCT/US2017/024169 | 3/2017 |
| WO | PCT/US2017/024171 | 3/2017 |
| WO | PCT/US2017/024172 | 3/2017 |

(56) References Cited

FOREIGN PATENT DOCUMENTS

| WO | PCT/US2017/024173 | 3/2017 |
|---|---|---|
| WO | PCT/US2017/024174 | 3/2017 |
| WO | PCT/US2017/024175 | 3/2017 |
| WO | PCT/US2017/024177 | 3/2017 |
| WO | PCT/US2017/024179 | 3/2017 |
| WO | PCT/US2017/024180 | 3/2017 |
| WO | PCT/US2017/024181 | 3/2017 |
| WO | PCT/US2017/024182 | 3/2017 |
| WO | WO-2017/039747 | 3/2017 |
| WO | PCT/US2017/035315 | 5/2017 |
| WO | WO-2017/095454 A1 | 6/2017 |
| WO | WO-2017/127079 A1 | 7/2017 |
| WO | WO-2017/127080 A1 | 7/2017 |
| WO | WO-2017/127081 A1 | 7/2017 |
| WO | WO-2017/127085 A1 | 7/2017 |
| WO | WO-2017/127090 A1 | 7/2017 |
| WO | WO-2017/127091 A1 | 7/2017 |
| WO | WO-2017/127093 A1 | 7/2017 |
| WO | WO-2017/127094 A1 | 7/2017 |
| WO | WO-2017/127095 A1 | 7/2017 |
| WO | WO-2017/127096 A1 | 7/2017 |
| WO | WO-2017/127097 A1 | 7/2017 |
| WO | WO-2017/127098 A1 | 7/2017 |

OTHER PUBLICATIONS

International Preliminary Report on Patentability dated Oct. 20, 2016 from related PCT application PCT/US2015/024723, 7 pages.
International Search Report and Written Opinion of the International Searching Authority dated Sep. 13, 2016 from related PCT application PCT/US16/14377, 11 pages.
Notice of Allowance dated Aug. 17, 2016, from related U.S. Appl. No. 15/003,718, 8 pages.
Notice of Allowance dated Sep. 8, 2016, from related U.S. Appl. No. 15/003,298, 10 pages.
Soykal et al., "Quantum metrology with a single spin-3/2 defect in silicon carbide," Mesoscale and Nanoscale Physics (May 24, 2016), retrieved from https://arxiv.org/abs/1605.07628 (Sep. 22, 2016), 9 pages.
Teale, "Magnetometry with Ensembles of Nitrogen Vacancy Centers in Bulk Diamond," Master's Thesis, Massachusetts Institute of Technology Department of Electrical Engineering and Computer Science (Sep. 2015), 57 pages.
U.S. Office Action dated Aug. 24, 2016 from related U.S. Appl. No. 14/676,740, 19 pages.
U.S. Office Action dated Oct. 14, 2016 from related U.S. Appl. No. 15/003,677, 13 pages.
U.S. Office Action dated Oct. 19, 2016 from related U.S. Appl. No. 15/218,821, 6 pages.
U.S. Office Action dated Nov. 2, 2016 from related U.S. Appl. No. 15/003,256, 19 pages.
U.S. Office Action dated Nov. 3, 2016 from related U.S. Appl. No. 15/204,675, 9 pages.
Widmann et al., "Coherent control of single spins in silicon carbide at room temperature," Nature Materials, 14: 164-168 (Feb. 2015) (available online Dec. 1, 2014), 5 pages.
GB Office Action dated Jan. 10, 2017, in related national stage application GB1618202.4.
Brenneis, et al. "Ultrafast electronic readout of diamond nitrogen-vacancy centres coupled to graphene." Nature nanotechnology 10.2 (2015): 135-139.
Chavez, et al. "Detecting Arctic oil spills with NMR: a feasibility study." Near Surface Geophysics 13.4 (Feb. 2015): 409-416.
Dale, et al. "Medical applications of diamond magnetometry: commercial viability." arXiv preprint arXiv:1705.01994 (May 8, 2017), pp. 1-7.
Fologea, et al. "Detecting single stranded DNA with a solid state nanopore." Nano Letters 5.10 (Aug. 15, 2005): 1905-1909.
Gaebel, et al. "Room-temperature coherent coupling of single spins in diamond." Nature Physics 2.6 (May 28, 2006): 408-413.

Heerema, et al. "Graphene nanodevices for DNA sequencing." Nature nanotechnology 11.2 (Feb. 3, 2016): 127-136.
International Search Report and Written Opinion of the International Searching Authority dated Apr. 4, 2017 from related PCT application PCT/US16/68366, 9 pages.
International Search Report and Written Opinion of the International Searching Authority dated Mar. 13, 2017 from related PCT application PCT/US2016/68320, 10 pages.
International Search Report and Written Opinion of the International Searching Authority dated Mar. 27, 2017 from related PCT application PCT/US16/68344, 6 pages.
International Search Report and Written Opinion of the International Searching Authority dated Mar. 31, 2017 from related PCT application PCT/US2016/066566, 11 pages.
International Search Report and Written Opinion of the International Searching Authority dated May 10, 2017 from related PCT application PCT/US17/19411, 8 pages.
International Search Report and Written Opinion of the International Searching Authority dated May 18, 2017, from related PCT application PCT/US2017/021593, 10 pages.
International Search Report and Written Opinion of the International Searching Authority dated May 19, 2017 from related PCT application PCT/US17/18099, 16 pages.
International Search Report and Written Opinion of the International Searching Authority dated May 3, 2017 from related PCT application PCT/US2017/018701, 8 pages.
International Search Report and Written Opinion of the International Searching Authority dated May 4, 2017 from related PCT application PCT/US2017/018709, 8 pages.
International Search Report and Written Opinion of the International Searching Authority dated May 8, 2017 from related PCT application PCT/US2017/17321, 17 pages.
Keyser "Enhancing nanopore sensing with DNA nanotechnology." Nature nanotechnology 11.2 (Feb. 2016): 106-108.
Lindsay "The promises and challenges of solid-state sequencing." Nature nanotechnology 11.2 (Feb. 2016): 109-111.
Matlashov, et al. "SQUIDs for magnetic resonance imaging at ultra-low magnetic field." PIERS online 5.5 (2009): 466-470.
Matlashov, et al. "SQUIDs vs. induction coils for ultra-low field nuclear magnetic resonance: experimental and simulation comparison." IEEE Transactions on Applied Superconductivity 21.3 (Jan. 1, 2012): 465-468.
Moessle, et al. "SQUID-detected magnetic resonance imaging in microtesla fields." Annu. Rev. Biomed. Eng. 9 (May 23, 2008): 389-413.
Pelliccione, et al., Two-dimensional nanoscale imaging of gadolinium spins via scanning probe relaxometry with a single spin in diamond, Phys. Rev. Applied 2.5, (Sep. 8, 2014): 054014 pp. 1-17.
Qiu et al., "Low-field NMR Measurement Procedure when SQUID Detection is Used," IEEE/CSC & ESAS European Superconductivity News Forum, No. 5, Jul. 2008.
Qiu, et al. "SQUID-detected NMR in Earth's magnetic field." Journal of Physics: Conference Series. vol. 97. No. 1. IOP Publishing, Mar. 2008, pp. 1-7.
Steinert et al., "Magnetic spin imaging under ambient conditions with sub-cellular resolution." Nature Comms 4:1607 (Mar. 19, 2013).
Sushkov, et al. "All-optical sensing of a single-molecule electron spin." Nano letters 14.11 (Nov. 7, 2013): 6443-6448.
Tetienne, et al. "Spin relaxometry of single nitrogen-vacancy defects in diamond nanocrystals for magnetic noise sensing." Physical Review B 87.23 (Apr. 3, 2013): 235436-1-235436-5.
U.S. Notice of Allowance dated Mar. 15, 2017, from related U.S. Appl. No. 15/351,862, 6 pages.
U.S. Notice of Allowance dated May 26, 2017 from related U.S. Appl. No. 15/218,821, 7 pages.
U.S. Office Action dated Apr. 17, 2017, from related U.S. Appl. No. 15/003,558, 12 pages.
U.S. Office Action dated Mar. 1, 2017, from related U.S. Appl. No. 15/003,634, 7 pages.
U.S. Office Action dated Mar. 16, 2017, from related U.S. Appl. No. 15/218,821, 7 pages.

(56) References Cited

OTHER PUBLICATIONS

U.S. Office Action dated May 22, 2017, from related U.S. Appl. No. 15/003,206, 12 pages.
Wells, et al. "Assessing graphene nanopores for sequencing DNA." Nano letters 12.8 (Jul. 10, 2012): 4117-4123.
Wysocki et al., "Modified Walsh-Hadamard sequences for DS CDMA wireless systems." Int. J. Adaptive Control and Signal Processing 16(8): 589-602 (Oct. 2002; first published online Sep. 23, 2002), 25 pages.
"'Diamond Sensors, Detectors, and Quantum Devices' in Patent Application Approval Process," Chemicals & Chemistry (Feb. 28, 2014).
"Findings from University of Stuttgart in physics reported," Physics Week (Jul. 7, 2009).
"New Findings on Nitrogen from Ecole Normale Superieure Summarized (Magnetic imaging with an ensemble of nitrogen vacancy-centers in diamond)," Physics Week (Jul. 21, 2015).
"Patent Issued for Diamond Sensors, Detectors, and Quantum Devices (USPTO 9249526)," Journal of Engineering (Feb. 15, 2016).
"Researchers Submit Patent Application, 'Diamond Sensors, Detectors, and Quantum Devices', for Approval," Chemicals & Chemistry (Apr. 11, 2014).
Acosta, "Optical Magnetometry with Nitrogen-Vacancy Centers in Diamond," University of California Berkeley, 2011.
Acosta, et al., "Diamonds with a high density of nitrogen—vacancy centers for magnetometry applications," Physical Review B, Sep. 2009.
Acosta, et al., "Nitrogen-vacancy centers: physics and applications," MRS Bulletin, 2013.
Aiello, et al., "Composite-pulse magnetometry with a solid-state quantum sensor," Nature Communications, Jan. 2013.
Alam, "Solid-state C-13 magic angle spinning NMR spectroscopy characterization of particle size structural variations in synthetic nanodiamonds," Materials Chemistry and Physics, Jun. 2004.
Albrecht, et al., "Coupling of nitrogen vacancy centres in nanodiamonds by means of phonons," New Journal of Physics, Aug. 2013.
Anthony, et al., "Jahn-Teller Splitting and Zeeman Effect of Acceptors in Diamond," 20th International Conference on Defects in Semiconductors, Jul. 1999.
Appel, et al., "Nanoscale microwave imaging with a single electron spin in diamond," New Journal of Physics, Nov. 2015.
Arai, et al., "Fourier magnetic imaging with nanoscale resolution and compressed sensing speed-up using electronic spins in diamond," Nature Nanotechnology, Oct. 2015.
Aslam, et al., "Single spin optically detected magnetic resonance with 60-90 GHz (E-band) microwave resonators," Review of Scientific Instruments, Jun. 2015.
Awschalom, et al., "Diamond age of spintronics," Scientific American, Oct. 2007.
Babamoradi, et al., "Correlation between entanglement and spin density in nitrogen-vacancy center of diamond," European Physical Journal D, Dec. 2011.
Babunts, et al., "Diagnostics of NV defect structure orientation in diamond using optically detected magnetic resonance with a modulated magnetic field," Technical Physics Letters, Jun. 2015.
Babunts, et al., "Temperature-scanned magnetic resonance and the evidence of two-way transfer of a nitrogen nuclear spin hyperfine interaction in coupled NV-N pairs in diamond," JETP Letters, Jun. 2012.
Bagguley, et al., "Zeeman effect of acceptor states in semiconducting diamond," Journal of the Physical Society of Japan, 1966.
Balasubramanian, et al., "Nanoscale imaging magnetometry with diamond spins under ambient conditions," Nature, Oct. 2008.
Balmer, et al., "Chemical Vapour deposition synthetic diamond: materials technology and applications," J. of Physics, 2009.
Baranov, et al., "Enormously High Concentrations of Fluorescent Nitrogen-Vacancy Centers Fabricated by Sintering of Detonation Nanodiamonds," Small, Jun. 2011.

Barfuss, et al., "Strong mechanical driving of a single electron spin," Nature Physics, Oct. 2015.
Bennett, et al., "CVD Diamond for High Power Laser Applications," Proceedings of SPIE, Jan. 2013.
Berman & Chernobrod, "Single-spin microscope with sub-nanoscale resolution based on optically detected magnetic resonance," Proceedings of SPIE, May 2010.
Berman, et al. "Measurement of single electron and nuclear spin states based on optically detected magnetic resonance," J. Physics: Conf. Series 38: 167-170 (2006).
Blakley, et al., "Room-temperature magnetic gradiometry with fiber-coupled nitrogen-vacancy centers in diamond," Optics Letters, Aug. 2015.
Bourgeois, et al., "Photoelectric detection of electron spin resonance of nitrogen-vacancy centres in diamond," Nature Communications, Oct. 2015.
Budker & Kimball, "Optical Magnetometry," Cambridge Press, 2013.
Budker & Romalis, "Optical Magnetometry," Nature Physics, 2007.
Casanova, et al., "Effect of magnetic field on phosphorus centre in diamond," Physica Status Solidi A, Jul. 2001.
Castelletto, et al., "Frontiers in diffraction unlimited optical methods for spin manipulation, magnetic field sensing and imaging using diamond nitrogen vacancy defects," Nanophotonics, 2012.
Chapman, et al., "Anomalous saturation effects due to optical spin depolarization in nitrogen-vacancy centers in diamond nanocrystals," Physical Review B, Jul. 2012.
Chen, et al., "Vector magnetic field sensing by a single nitrogen vacancy center in diamond," EPL, Mar. 2013.
Chernobrod, et al., "Improving the sensitivity of frequency modulation spectroscopy using nanomechanical cantilevers," Applied Physics Letters, 2004.
Chernobrod, et al., "Spin Microscope Based on Optically Detected Magnetic Resoncance," Journal of Applied Physics, 2005.
Childress, et al., "Coherent dynamics of coupled electron and nuclear spin qubits in diamond," Science, 2006.
Chipaux, et al., "Magnetic imaging with an ensemble of nitrogen vacancy-centers in diamond," European Physical Journal D, Jul. 2015.
Chipaux, et al., "Nitrogen vacancies (NV) centers in diamond for magnetic sensors and quantum sensing," Proceedings of SPIE, Jan. 2015.
Chipaux, et al., "Wide bandwidth instantaneous radio frequency spectrum analyzer based on nitrogen vacancy centers in diamond," Applied Physics Letters, Dec. 2015.
Clevenson, et al., "Broadband magnetometry and temperature sensing with a light-trapping diamond waveguide," Nature Physics, May 2015.
Cooper, et al., "Time-resolved magnetic sensing with electronic spins in diamond," Nature Communications, Jan. 2014.
Creedon, et al., "Strong coupling between P1 diamond impurity centers and a three-dimensional lumped photonic microwave cavity," Physical Review B, Apr. 2015.
Davies, "Current problems in diamond: towards a quantitative understanding," Physica B—Condensed Matter, Dec. 1999.
De Lange, et al., "Single-Spin Magnetometry with Multipulse Sensing Sequences," Physical Review Letters, Feb. 2011.
Degen, "Scanning magnetic field microscope with a diamond single-spin sensor ," Applied Physics Letters, 2008.
Delacroix, et al., "Design, manufacturing, and performance analysis of mid-infrared achromatic half-wave plates with diamond subwavelength gratings," Applied Optics, 2012.
Denatale, et al., "Fabrication and characterization of diamond moth eye antireflective surfaces on Ge," J. of Applied Physics, 1982.
Dobrovitski, et al., "Quantum Control over Single Spins in Diamond," Annual Review of Condensed Matter Physics vol. 4, 2013.
Doherty, et al., "The nitrogen-vacancy colour centre in diamond," Physics Reports, Jul. 2013.
Doherty, et al., "Theory of the ground-state spin of the NV-center in diamond," Physical Review B, May 2012.
Doi, et al., "Pure negatively charged state of the NV center in n-type diamond," Physical Review B, Feb. 2016.

(56) References Cited

OTHER PUBLICATIONS

Drake, et al., "Influence of magnetic field alignment and defect concentration on nitrogen-vacancy polarization in diamond," New Journal of Physics, Jan. 2016.

Dreau, et al., "Avoiding power broadening in optically detected magnetic resonance of single NV defects for enhanced dc magnetic field sensitivity," Physical Review B, Nov. 2011.

Dreau, et al., "High-resolution spectroscopy of single NV defects coupled with nearby C-13 nuclear spins in diamond," Physical Review B, Apr. 2012.

Dumeige, et al., "Magnetometry with nitrogen-vacancy ensembles in diamond based on infrared absorption in a doubly resonant optical cavity," Physical Review B, Apr. 2013.

Epstein, et al., "Anisotropic interactions of a single spin and dark-spin spectroscopy in diamond," Center for Spintronics and Quantum Computation, 2005.

Fedotov, et al., "High-resolution magnetic field imaging with a nitrogen-vacancy diamond sensor integrated with a photonic-crystal fiber," Optics Letters, Feb. 2016.

Fedotov, et al., "Photonic-crystal-fiber-coupled photoluminescence interrogation of nitrogen vacancies in diamond nanoparticles," Laser Physics Letters, Feb. 2012.

Feng & Wei, "A steady-state spectral method to fit microwave absorptions of NV centers in diamonds: application to sensitive magnetic field sensing," Measurement Science & Technology, Oct. 2014.

Freitas, et al., "Solid-State Nuclear Magnetic Resonance (NMR) Methods Applied to the Study of Carbon Materials," Chemistry and Physics of Carbon, vol. 31, 2012.

Geiselmann, et al., "Fast optical modulation of the fluorescence from a single nitrogen-vacancy centre," Nature Physics, Dec. 2013.

Gombert & Blasi, "The Moth-Eye Effect-From Fundamentals to Commercial Exploitation," Functional Properties of Bio-Inspired Surfaces, Nov. 2009.

Gong, et al., "Generation of Nitrogen-Vacancy Center Pairs in Bulk Diamond by Molecular Nitrogen Implantation," Chinese Physics Letters, Feb. 2016.

Gould, et al., "An imaging magnetometer for bio-sensing based on nitrogen-vacancy centers in diamond," Proceedings of the SPIE—Progress in Biomedical Optics and Imaging, 2014.

Gould, et al., "Room-temperature detection of a single 19 nm super-paramagnetic nanoparticle with an imaging magnetometer," Applied Physics Letters, Aug. 2014.

Gruber, et al., "Scanning confocal optical microscopy and magnetic resonance on single defect centers," Science, Jun. 1997.

Haeberle, et al., "Nanoscale nuclear magnetic imaging with chemical contrast," Nature Nanotechnology, Feb. 2015.

Haihua, et al., "Design of wideband anti-reflective sub wavelength nanostructures," Infrared and Laser Engineering, 2011.

Hall, et al., "Sensing of Fluctuating Nanoscale Magnetic Fields Using Nitrogen-Vacancy Centers in Diamond," Physical Review Letters, Nov. 2009.

Hanson, et al., "Coherent Dynamics of a single spin interacting with an adjustable spin bath," Sci. Am. Ass'n. For the Advancement of Science, 2008.

Hanson, et al., "Polarization and Readout of Coupled Single Spins in Diamond," Physical Review Letters, 2006.

Hanson, et al., "Room-temperature manipulation and decoherence of a single spin in diamond," Physical Review, 2006.

Hanzawa, et al., "Zeeman effect on the zero-phonon line of the NV center in synthetic diamond," Physica B, Feb. 1993.

Hegyi & Yablonovitch, "Molecular imaging by optically detected electron spin resonance of nitrogen-vacancies in nanodiamonds," Nano Letters, Mar. 2013.

Hegyi & Yablonovitch, "Nanodiamond molecular imaging with enhanced contrast and expanded field of view," Journal of Biomedical Optics, Jan. 2014.

Hilser, et al., "All-optical control of the spin state in the NV-center in diamond," Physical Review B, Sep. 2012.

Hobbs, "Study of the Environmental and Optical Durability of AR Microstructures in Sapphire, ALON, and Diamond," Proceedings of SPIE, 2009.

Huebener, et al., "ODMR of NV centers in nano-diamonds covered with N@C60," Physica Status Solidi B, Oct. 2008.

Huxter, et al., "Vibrational and electronic dynamics of nitrogen-vacancy centres in diamond revealed by two-dimensional ultrafast spectroscopy," Nature Physics, Nov. 2013.

Ivady, et al., "Pressure and temperature dependence of the zero-field splitting in the ground state of NV centers in diamond: A first-principles study," Physical Review B, Dec. 2014.

Jarmola, et al., "Temperature- and Magnetic-Field-Dependent Longitudinal Spin Relaxation in Nitrogen-Vacancy Ensembles in Diamond," Physical Review Letters, May 2012.

Jensen, et al., "Light narrowing of magnetic resonances in ensembles of nitrogen-vacancy centers in diamond," Physical Review, Jan. 2013.

Kailath, "Linear Systems," Prentice Hall, 1979.

Karlsson, et al., "Diamond micro-optics: microlenses and antireflection structures surfaces for the infrared spectral region," Optics Express, 2003.

Khan & Hemmer, "Noise limitation in nano-scale imaging," Proceedings of SPIE, Dec. 2005.

Kim, et al., "Electron spin resonance shift and linewidth broadening of nitrogen-vacancy centers in diamond as a function of electron irradiation dose," Applied Physics Letters, Aug. 2012.

Kim, et al., "Magnetospectroscopy of acceptors in 'blue' diamonds," Physica B, Aug. 2001.

Kim, et al., "Zeeman effect of electronic Raman lines of accepters in elemental semiconductors: Boron in blue diamond," Physical Review B, Sep. 2000.

King, et al., "Optical polarization of 13C nuclei in diamond through nitrogen vacancy centers," Physical Review B, Feb. 2010.

Kok, et al., "Materials Science: Qubits in the pink," Nature, 2006.

Konenko, et al., "Formation of antireflective surface structures on diamond films by laser patterning," Applied Physics A, 1999.

Kraus, et al., "Magnetic field and temperature sensing with atomic-scale spin defects in silicon carbide," Scientific Reports, Jul. 2014.

Lai, et al., "Influence of a static magnetic field on the photoluminescence of an ensemble of nitrogen-vacancy color centers in a diamond single-crystal," Applied Physics Letters, Sep. 2009.

Lai, et al., "Optically detected magnetic resonance of a single Nitrogen-Vacancy electronic spin in diamond nanocrystals," CLEO/EQEC, 2009.

Laraoui, et al., "Nitrogen-vacancy-assisted magnetometry of paramagnetic centers in an individual diamond nanocrystal," Nano Letters, Jul. 2012.

Lazariev, et al., "A nitrogen-vacancy spin based molecular structure microscope using multiplexed projection reconstruction," Scientific Reports, Sep. 2015.

Lee, et al., "Vector magnetometry based on S=3/2 electronic spins," Physical Review B, Sep. 2015.

Lesik, et al., "Preferential orientation of NV defects in CVD diamond films grown on (113)-oriented substrates," Diamond and Related Materials, Jun. 2015.

Levchenko, et al., "Inhomogeneous broadening of optically detected magnetic resonance of the ensembles of nitrogen-vacancy centers in diamond by interstitial carbon atoms," Applied Physics Letters, Mar. 2015.

Liu, et al., "Electron spin studies of nitrogen vacancy centers in nanodiamonds," Acta Physica Sinica, Aug. 2013.

Liu, et al., "Fiber-integrated diamond-based magnetometer," Applied Physics Letters, Sep. 2013.

MacLaurin, et al., "Nanoscale magnetometry through quantum control of nitrogen-vacancy centres in rotationally diffusing nanodiamonds," New Journal of Physics, Jan. 2013.

Macs, et al., "Diamond as a magnetic field calibration probe," Journal of Physics D: Applied Physics, Apr. 2004.

Maletinsky, et al., "A robust scanning diamond sensor for nanoscale imaging with single nitrogen-vacancy centres," Nature Nanotechnology, May 2012.

(56) References Cited

OTHER PUBLICATIONS

Mamin, et al., "Multipulse Double-Quantum Magnetometry with Near-Surface Nitrogen-Vacancy Centers," Physical Review Letters, Jul. 2014.
Mamin, et al., "Nanoscale Nuclear Magnetic Resonance with a Nitrogen-Vacancy Spin Sensor," Science, Feb. 2013.
Manson, et al., "GR transitions in diamond: magnetic field measurements," Journal of Physics C, Nov. 1980.
Massachusetts Institute of Technology; "Wide-Field Imaging Using Nitrogen Vacancies" in Patent Application Approval Process, Physics Week (2015).
Matsuda, et al., "Development of a plastic diamond anvil cell for high pressure magneto-photoluminescence in pulsed high magnetic fields," International Journal of Modern Physics B, Nov. 2004.
Maze et al., "Nanoscale magnetic sensing with an individual electronic spin in diamond," Nature Physics (2008).
Maze, et al., "Nanoscale magnetic sensing using spin qubits in diamond," Nature Physics, 2009.
Meijer, et al., "Generation of single color centers by focused nitrogen implantation," Applied Physics Letters, Dec. 2005.
Millot, et al., "High-field Zeeman and paschen-back effects at high pressure in oriented ruby," Physical Review B, Oct. 2008.
Moriyama, et al., "Importance of electron-electron interactions and Zeeman splitting in single-wall carbon nanotube quantum dots," Physica E, Feb. 2005.
Mrozek, et al., "Circularly polarized microwaves for magnetic resonance study in the GHz range: Application to nitrogen-vacancy in diamonds," Applied Physics Letters, Jul. 2015.
Nagl, et al., "Improving surface and defect center chemistry of fluorescent nanodiamonds for imaging purposes—a review," Analytical and Bioanalaytical Chemistry, Oct. 2015.
Neumann, et al., "Excited-state spectroscopy of single NV defects in diamond using optically detected magnetic resonance," New Journal of Physics, Jan. 2009.
Nizovtsev & Kilin, "Optically Detected Magnetic Resonance Spectra of the 14NV-13C Spin Systems in Diamond: Analytical Theory and Experiment," Doklady of the National Academy of Sciences of Belarus, 2013.
Nizovtsev, et al., "Modeling fluorescence of single nitrogen-vacancy defect centers in diamond," Physica B—Condensed Matter, Dec. 2001.
Nizovtsev, et al., "Theoretical study of hyperfine interactions and optically detected magnetic resonance spectra by simulation of the C-291(NV)H—(172) diamond cluster hosting nitrogen vacancy center," New Journal of Physics, Aug. 2014.
Nowodzinski, et al., "Nitrogen-Vacancy centers in diamond for current imaging at the redistributive layer level of Integrated Circuits," Microelectronics Reliability, Aug. 2015.
Nusran, et al., "Optimizing phase-estimation algorithms for diamond spin magnetometry," Physical Review B, Jul. 2014.
Ohashi, et al., "Negatively Charged Nitrogen-Vacancy Centers in a 5 nm Thin C-12 Diamond Film," Nano Letters, Oct. 2013.
Plakhotnik, et al., "Super-Paramagnetic Particles Chemically Bound to Luminescent Diamond : Single Nanocrystals Probed with Optically Detected Magnetic Resonance," Journal of Physical Chemistry C, Aug. 2015.
Rabeau, et al., "Implantation of labelled single nitrogen vacancy centers in diamond using N-15," Applied Physics Letters, Jan. 2006.
Ranjbar, et al., "Many-electron states of nitrogen-vacancy centers in diamond and spin density calculations," Physical Review B, Oct. 2011.
Reynhardt, "Spin-lattice relaxation of spin-1/2 nuclei in solids containing diluted paramagnetic impurity centers. I. Zeeman polarization of nuclear spin system," Concepts in Magnetic Resonance Part A, Sep. 2003.
Rogers, et al., "Singlet levels of the NV(−)centre in diamond," New Journal of Physics, Jan. 2015.
Rondin, et al., "Magnetometry with nitrogen-vacancy defects in diamond," Reports on Progress in Physics, May 2014.
Rondin, et al., "Nanoscale magnetic field mapping with a single spin scanning probe magnetometer," Applied Physics Letters, Apr. 2012.
Sarkar, et al., "Magnetic properties of graphite oxide and reduced graphene oxide," Physica E, 2014.
Scheuer, et al., "Accelerated 2D magnetic resonance spectroscopy of single spins using matrix completion," Scientific Reports, Dec. 2015.
Schirhagl, et al., "Nitrogen-vacancy centers in diamond: Nanoscale sensors for physics and biology," Annual Review of Physical Chemistry, Jan. 2014.
Schoenfeld & Harneit, "Real time magnetic field sensing and imaging using a single spin in diamond," Physical Review Letters, Jan. 2011.
Sedov, et al., "Si-doped nano- and microcrystalline diamond films with controlled bright photoluminescence of silicon-vacancy color centers," Diamond and Related Materials, Jun. 2015.
Shames, et al., "Magnetic resonance tracking of fluorescent nanodiamond fabrication," Journal of Physics D: Applied Physics, Apr. 2015.
Simanovskaia, et al., "Sidebands in optically detected magnetic resonance signals of nitrogen vacancy centers in diamond," Physical Review B, Jun. 2013.
Sotoma, et al., "Effective production of fluorescent nanodiamonds containing negatively-charged nitrogen-vacancy centers by ion irradiation," Diamond and Related Materials, Oct. 2014.
Steiner, et al., "Universal enhancement of the optical readout fidelity of single electron spins at nitrogen-vacancy centers in diamond," Physical Review B, Jan. 2010.
Steinert et al., "High-sensitivity magnetic imaging using an array of spins in diamond," Rev. Sci. Inst. (2010).
Steinert, et al., "High sensitivity magnetic imaging using an array of spins in diamond," Review of Scientific Instruments, Apr. 2010.
Stepanov, et al., "High-frequency and high-field optically detected magnetic resonance of nitrogen-vacancy centers in diamond," Applied Physics Letters, Feb. 2015.
Sternschulte, et al., "Uniaxial stress and Zeeman splitting of the 1.681 eV optical center in a homoepitaxial CVD diamond film," Diamond and Related Materials, Sep. 1995.
Storteboom, et al., "Lifetime investigation of single nitrogen vacancy centres in nanodiamonds," Optics Express, May 2015.
Tahara, et al., "Quantifying selective alignment of ensemble nitrogen-vacancy centers in (111) diamond," Applied Physics Letters, Nov. 2015.
Taylor, et al., "High-sensitivity diamond magnetometer with nanoscale resolution," Nature Physics, Oct. 2008.
Terblanche, et al., "13C spin-lattice relaxation in natural diamond: Zeeman relaxation at 4.7 T and 300 K due to fixed paramagnetic nitrogen defects," Solid State Nuclear Magnetic Resonance, Aug. 2001.
Terblanche, et al., "13C spin-lattice relaxation in natural diamond: Zeeman relaxation in fields of 500 to 5000 G at 300 K due to fixed paramagnetic nitrogen defects," Solid State Nuclear Magnetic Resonance, May 2001.
Tetienne, et al., "Magnetic-field-dependent photodynamics of single NV defects in diamond: an application to qualitative all-optical magnetic imaging," New Journal of Physics, Oct. 2012.
Tong, et al., "A hybrid-system approach for W state and cluster state generation," Optics Communication 310: 166-172 (2014).
Uhlen, et al., "New Diamond Nanofabrication process for hard x-ray zone plates," J. of Vacuum Science & Tech. B, 2011.
Vershovskii & Dmitriev, "Combined excitation of an optically detected magnetic resonance in nitrogen-vacancy centers in diamond for precision measurement of the components of a magnetic field vector," Technical Physics Letters, Nov. 2015.
Vershovskii & Dmitriev, "Micro-scale three-component quantum magnetometer based on nitrogen-vacancy color centers in diamond crystal," Technical Physics Letters, Apr. 2015.
Wang, et al., "Optimizing ultrasensitive single electron magnetometer based on nitrogen-vacancy center in diamond," Chinese Science Bulletin, Aug. 2013.
Webber, et al., "Ab initio thermodynamics calculation of the relative concentration of NV- and NV0 defects in diamond," Physical Review B, Jan. 2012.

(56) References Cited

OTHER PUBLICATIONS

Wolf, et al., "Subpicotesla Diamond Magnetometry," Physical Review X, Oct. 2015.
Wolfe, et al., "Off-resonant manipulation of spins in diamond via precessing magnetization of a proximal ferromagnet," Physical Review B, May 2014.
Xue & Liu, "Producing GHZ state of nitrogen-vacancy centers in cavity QED," Journal of Modern Optics, Mar. 2013.
Yang & Gu, "Novel calibration techniques for high pulsed-magnetic fields using luminescence caused by photo," Journal of Huazhong University of Science and Technology, Jun. 2007.
Yavkin, et al., "Defects in Nanodiamonds: Application of High-Frequency cw and Pulse EPR, ODMR," Applied Magnetic Resonance, Oct. 2014.
Yu, et al., "Bright fluorescent nanodiamonds: no photobleaching and low cytotoxicity," J. Am. Chem. Soc., 2005.
Zhang, et al., "Laser-polarization-dependent and magnetically controlled optical bistability in diamond nitrogen-vacancy centers," Physics Letters A, Nov. 2013.
Zhang, et al., "Laser-polarization-dependent spontaneous emission of the zero phonon line from single nitrogen-vacancy center in diamond," Chinese Physics B, Apr. 2014.
Zhang, et al., "Scalable quantum information transfer between nitrogen-vacancy-center ensembles," Annals of Physics, Apr. 2015.
Zhao, et al., "Atomic-scale magnetometry of distant nuclear spin clusters via nitrogen-vacancy spin in diamond," Nature Nanotechnology, Apr. 2011.
Acosta et al., "Broadband magnetometry by infrared-absorption detection of nitrogen-vacancy ensembles in diamond," Appl. Phys. Letters 97: 174104 (Oct. 29, 2010), 4 pages.
Barry et al., "Optical magnetic detection of single-neuron action potentials using quantum defects in diamond," as submitted to Quantum Physics on Feb. 2, 2016, 23 pages.
Constable, "Geomagnetic Spectrum, Temporal." In Encyclopedia of Geomagnetism and Paleomagnetism, pp. 353-355, Springer: Dordrecht, Netherlands (2007).
International Search Report and Written Opinion of the International Searching Authority dated Apr. 1, 2016 from related PCT application PCT/US2016/014384, 12 pages.
International Search Report and Written Opinion of the International Searching Authority dated Apr. 11, 2016 from related PCT application PCT/US2016/014376, 12 pages.
International Search Report and Written Opinion of the International Searching Authority dated Apr. 11, 2016 from related PCT application PCT/US2016/014388, 14 pages.
International Search Report and Written Opinion of the International Searching Authority dated Apr. 11, 2016 from related PCT application PCT/US2016/014395, 15 pages.
International Search Report and Written Opinion of the International Searching Authority dated Jul. 6, 2015, from related PCT application PCT/US2015/021093, 9 pages.
International Search Report and Written Opinion of the International Searching Authority dated Jul. 8, 2015, from related PCT application PCT/US2015/024265, 11 pages.
International Search Report and Written Opinion of the International Searching Authority dated Jul. 12, 2016, from related PCT application PCT/US2016/014287, 14 pages.
International Search Report and Written Opinion of the International Searching Authority dated Jul. 16, 2015, from related PCT application PCT/US2015/24723, 8 pages.
International Search Report and Written Opinion of the International Searching Authority dated Jun. 10, 2016 from related PCT application PCT/US2016/014290, 11 pages.
International Search Report and Written Opinion of the International Searching Authority dated Jun. 2, 2016 from related PCT application PCT/US2016/014386, 14 pages.
International Search Report and Written Opinion of the International Searching Authority dated Jun. 2, 2016 from related PCT application PCT/US2016/014387, 13 pages.
International Search Report and Written Opinion of the International Searching Authority dated Jun. 6, 2016, from related PCT application PCT/US2016/014291, 13 pages.
International Search Report and Written Opinion of the International Searching Authority dated Jun. 9, 2016 from related PCT application PCT/US2016/014333, 16 pages.
International Search Report and Written Opinion of the International Searching Authority dated Mar. 24, 2016 from related PCT application PCT/US2016/014336, 17 pages.
International Search Report and Written Opinion of the International Searching Authority dated Mar. 24, 2016 from related PCT application PCT/US2016/014297, 15 pages.
International Search Report and Written Opinion of the International Searching Authority dated Mar. 24, 2016 from related PCT application PCT/US2016/014392, 8 pages.
International Search Report and Written Opinion of the International Searching Authority dated Mar. 24, 2016 from related PCT application PCT/US2016/014403, 10 pages.
International Search Report and Written Opinion of the International Searching Authority dated Mar. 25, 2016, from related PCT application PCT/US2016/014363, 8 pages.
International Search Report and Written Opinion of the International Searching Authority dated Mar. 25, 2016 from related PCT application PCT/US2016/014389, 19 pages.
International Search Report and Written Opinion of the International Searching Authority dated Mar. 28, 2016, from related PCT application PCT/US2016/014380, 9 pages.
International Search Report and Written Opinion of the International Searching Authority dated Mar. 28, 2016 from related PCT application PCT/US2016/014394, 17 pages.
International Search Report and Written Opinion of the International Searching Authority dated Mar. 29, 2016 from related PCT application PCT/US2016/014325, 11 pages.
International Search Report and Written Opinion of the International Searching Authority dated Mar. 29, 2016 from related PCT application PCT/US2016/014330, 8 pages.
International Search Report and Written Opinion of the International Searching Authority dated Mar. 29, 2016, from related PCT application PCT/US2016/014328, 7 pages.
International Search Report and Written Opinion of the International Searching Authority dated Mar. 29, 2016, from related PCT application PCT/US2016/014385, 11 pages.
International Search Report and Written Opinion of the International Searching Authority dated Mar. 30, 2016 from related PCT application PCT/US2016/014298, 14 pages.
International Search Report and Written Opinion of the International Searching Authority dated Mar. 31, 2016 from related PCT application PCT/US2016/014375, 11 pages.
International Search Report and Written Opinion of the International Searching Authority dated Mar. 31, 2016 from related PCT application PCT/US2016/014396, 11 pages.
International Search Report and Written Opinion of the International Searching Authority dated May 26, 2016, 2016 from related PCT application PCT/US2016/014331, 15 pages.
Le Sage et al., "Efficient photon detection from color centers in a diamond optical waveguide," Phys. Rev. B 85: 121202(R), pp. 121202-1-121202-4, (Mar. 23, 2012).
MacQuarie et al., "Mechanical spin control of nitrogen-vacancy centers in diamond," Retrieved from http://www.arxiv.org/pdf/1306.6356.pdf, pp. 1-8, (Jun. 2013).
Nobauer et al., "Smooth optimal quantum control for robust solid state spin magnetometry," Retrieved from http://www.arxiv.org/abs/1412.5051, pp. 1-12, (Dec. 2014).
Polatomic. "AN/ASQ-233A Digital Magnetic Anomaly Detecting Set." Retrieved May 9, 2016, from http://polatomic.com/images/DMAD_Data_Sheet_09-2009.pdf (2009), 1 page.
Poole, "What is GMSK Modulation—Gaussian Minimum Shift Keying." Radio-Electronics, retrieved from https://web.archive.org/web/20150403045840/http://www.radio-electronics.com/info/rf-technology-design/pm-phase-modulation/what-is-gmsk-gaussian-minimum-shift-keyingtutorial.php (Apr. 3, 2015), 4 pages.
Shao et al., "Diamond Color Center Based FM Microwave Demodulator," in Conference on Lasers and Electro-Optics, OSA

(56) References Cited

OTHER PUBLICATIONS

Technical Digest (online) (Optical Society of America), paper JTh2A.136, 2 pages. (Jun. 5-10, 2016).
U.S. Notice of Allowance dated Apr. 20, 2016, from related U.S. Appl. No. 15/003,718, 9 pages.
U.S. Notice of Allowance dated Mar. 29, 2016, from related U.S. Appl. No. 15/003,590, 11 pages.
U.S. Office Action dated Jul. 29, 2016 from related U.S. Appl. No. 14/680,877, 8 pages.
U.S. Office Action dated May 13, 2016, from related U.S. Appl. No. 14/676,740, 15 pages.
U.S. Office Action dated May 6, 2016, from related U.S. Appl. No. 14/659,498, 20 pages.
Wahlstrom et al., "Modeling Magnetic Fields Using Gaussian Processes," 2013 IEEE International Conference on Acoustics, Speech, and Signal Processing, pp. 3522-3526 (May 26-31, 2013).
International Search Report and Written Opinion from related PCT application PCT/US2017/035315 dated Aug. 24, 2017, 7 pages.
Ramsey, et al., "Phase Shifts in the Molecular Beam Method of Separated Oscillating Fields", Physical Review, vol. 84, No. 3, Nov. 1, 1951, pp. 506-507.
U.S. Notice of Allowance on U.S. Appl. No. 14/676,740 dated Sep. 1, 2017, 7 pages.
U.S. Notice of Allowance on U.S. Appl. No. 15/003,206 dated Sep. 18, 2017, 11 pages.
U.S. Notice of Allowance on U.S. Appl. No. 15/003,281 dated Sep. 26, 2017, 7 pages.
U.S. Notice of Allowance on U.S. Appl. No. 15/476,636 dated Sep. 14, 2017, 10 pages.
U.S. Office Action on U.S. Appl. No. 15/003,176 dated Sep. 27, 2017, 8 pages.
U.S. Office Action on U.S. Appl. No. 15/003,292 dated Sep. 8, 2017, 8 pages.
U.S. Appl. No. 15/610,526, filed May 31, 2017.
U.S. Appl. No. 15/672,953, filed Aug. 9, 2017.
U.S. Notice of Allowance dated Oct. 19, 2017, from related U.S. Appl. No. 15/179,957, 5 pages.
U.S. Notice of Allowance dated Oct. 23, 2017, from related U.S. Appl. No. 15/003,797, 6 pages.
U.S. Office Action dated Nov. 24, 2017, from related U.S. Appl. No. 15/003,145, 14 pages.
U.S. Office Action dated Nov. 27, 2017, from related U.S. Appl. No. 15/468,386, 28 pages.
U.S. Appl. No. 14/659,498, filed Mar. 16, 2015.
U.S. Appl. No. 14/676,740, filed Apr. 1, 2015.
U.S. Appl. No. 15/003,678, filed Jan. 21, 2016.
U.S. Appl. No. 14/680,877, filed Apr. 7, 2015.
U.S. Appl. No. 15/003,281, filed Jan. 21, 2016.
U.S. Appl. No. 15/003,292, filed Jan. 21, 2016.
U.S. Appl. No. 15/003,298, filed Jan. 21, 2016.
U.S. Appl. No. 15/003,309, filed Jan. 21, 2016.
U.S. Appl. No. 15/003,176, filed Jan. 21, 2016.
U.S. Appl. No. 15/003,145, filed Jan. 21, 2016.
U.S. Appl. No. 15/003,336, filed Jan. 21, 2016.
U.S. Appl. No. 15/003,558, filed Jan. 21, 2016.
U.S. Appl. No. 15/003,519, filed Jan. 21, 2016.
U.S. Appl. No. 15/003,677, filed Jan. 21, 2016.
U.S. Appl. No. 15/003,256, filed Jan. 21, 2016.
U.S. Appl. No. 15/003,577, filed Jan. 21, 2016.
U.S. Appl. No. 15/003,704, filed Jan. 21, 2016.
U.S. Appl. No. 15/003,718, filed Jan. 21, 2016.
U.S. Appl. No. 15/003,062, filed Jan. 21, 2016.
U.S. Appl. No. 15/003,652, filed Jan. 21, 2016.
U.S. Appl. No. 15/003,634, filed Jan. 21, 2016.
U.S. Appl. No. 15/003,670, filed Jan. 21, 2016.
U.S. Appl. No. 15/003,088, filed Jan. 21, 2016.
U.S. Appl. No. 15/003,797, filed Jan. 21, 2016.
U.S. Appl. No. 15/003,590, filed Jan. 21, 2016.
U.S. Appl. No. 15/003,206, filed Jan, 21, 2016.
U.S. Appl. No. 15/003,193, filed Jan. 21, 2016.
U.S. Appl. No. 15/003,617, filed Jan. 21, 2016.
U.S. Appl. No. 15/003,396, filed Jan. 21, 2016.
U.S. Appl. No. 15/003,177, filed Jan. 21, 2016.
U.S. Appl. No. 15/003,209, filed Jan. 21, 2016.
U.S. Appl. No. 15/179,957, filed Jun. 10, 2016.
U.S. Appl. No. 15/207,457, filed Jul. 11, 2016.
U.S. Appl. No. 15/218,821, filed Jul. 25, 2016.
U.S. Appl. No. 15/204,675, filed Jul. 7, 2016.
U.S. Appl. No. 15/350,303, filed Nov. 14, 2016.
U.S. Appl. No. 15/351,862, filed Jul. 7, 2016.
U.S. Appl. No. 15/372,201, filed Dec. 7, 2016.
U.S. Appl. No. 15/376,244, filed Dec. 12, 2016.
U.S. Appl. No. 15/380,691, filed Dec. 15, 2016.
U.S. Appl. No. 15/382,045, filed Dec. 16, 2016.
U.S. Appl. No. 15/380,419, filed Dec. 15, 2016.
U.S. Appl. No. 15/419,832, filed Jan. 30, 2017.
U.S. Appl. No. 15/400,794, filed Jan. 6, 2017.
U.S. Appl. No. 15/443,422, filed Jan. 27, 2017.
U.S. Appl. No. 15/440,194, filed Feb. 23, 2017.
U.S. Appl. No. 15/437,222, filed Feb. 20, 2017.
U.S. Appl. No. 15/437,038, filed Feb. 20, 2017.
International Search Report and Written Opinion of the International Searching Authority in PCT/US2016/014390 dated Feb. 15, 2017.
Notice of Allowance dated Dec. 13, 2016, from related U.S. Appl. No. 14/680,877.
Notice of Allowance dated Dec. 22, 2016, from related U.S. Appl. No. 14/659,498.
U.S. Notice of Allowance dated Feb. 14, 2017, from related U.S. Appl. No. 15/003,677, 8 pages.
U.S. Office Action dated Feb. 10, 2017, from related U.S. Appl. No. 14/676,740, 38 pages.
U.S. Office Action dated Feb. 10, 2017, from related U.S. Appl. No. 15/003,088, 32 pages.
U.S. Office Action dated Feb. 16, 2017, from related U.S. Appl. No. 15/204,675, 15 pages.
Bucher et al, "High Resolution Magnetic Resonance Spectroscopy Using Solid-State Spins", May 25, 2017, downloaded from https://arxiv.org/ (arXiv.org > quant-ph > arXiv:1705.08887) on May 25, 2017, pp. 1-24.
International Search Report and Written Opinion of the International Searching Authority dated Jun. 1, 2017, from related PCT application PCT/US17/21811, 9 pages.
International Search Report and Written Opinion of the International Searching Authority dated Jun. 1, 2017, in related PCT application PCT/US17/22279, 20 pages.
International Search Report and Written Opinion of the International Searching Authority dated Jun. 15, 2017, from related PCT application PCT/US2017/024175, 10 pages.
International Search Report and Written Opinion of the International Searching Authority dated Jun. 9, 2017, from related patent application PCT/US2017/024181, 13 pages.
International Search Report and Written Opinion of the International Searching Authority dated Jun. 9, 2017, from related PCT application PCT/US2017/024179, 9 pages.
International Search Report and Written Opinion of the International Searching Authority dated Jul. 14, 2017, from related PCT application PCT/US2017/022118, 13 pages.
International Search Report and Written Opinion of the International Searching Authority dated Jul. 17, 2017, from related PCT application PCT/US2017/024177, 11 pages.
International Search Report and Written Opinion of the International Searching Authority dated Jul. 18, 2017, from related PCT application PCT/US2017/024167, 11 pages.
International Search Report and Written Opinion of the International Searching Authority dated Jul. 18, 2017, from related PCT application PCT/US2017/024173, 13 pages.
International Search Report and Written Opinion of the International Searching Authority dated Jul. 19, 2017, from related PCT application PCT/US2017/024171, 12 pages.
International Search Report and Written Opinion of the International Searching Authority dated Jun. 15, 2017, from related PCT application PCT/US2017/024182, 21 pages.

(56) References Cited

OTHER PUBLICATIONS

International Search Report and Written Opinion of the International Searching Authority dated Jun. 22, 2017, in related PCT application PCT/US2017/024180, 10 pages.
International Search Report and Written Opinion of the International Searching Authority dated Jun. 5, 2017, from related PCT application PCT/US2017/024169, 11 pages.
International Search Report and Written Opinion of the International Searching Authority dated Jun. 5, 2017, from related PCT application PCT/US2017/024174, 8 pages.
International Search Report and Written Opinion of the International Searching Authority dated Jun. 5, 2017, in related PCT application PCT/US2017/024168, 7 pages.
International Search Report and Written Opinion of the International Searching Authority dated Jun. 6, 2017, from related PCT application PCT/2017/024165, 9 pages.
International Search Report and Written Opinion of the International Searching Authority dated Jun. 6, 2017, from related PCT application PCT/US2017/024172, 9 pages.
Michaelovich et al., "Polarization Dependencies of the Nitrogen-Vacancy Center." Undergraduate Project Report, Ben-Gurion University, Aug. 2015, pp. 1-9.
Notice of Allowance dated Jun. 8, 2017, from related U.S. Appl. No. 15/351,862, 7 pages.
Sheinker et al., "Localization in 3-D Using Beacons of Low Frequency Magnetic Field." IEEE Transactions on Instrumentation and Measurement 62(12): 3194-3201 (Dec. 2013), 8 pages.
U.S. Notice of Allowance dated Aug. 11, 2017 from related U.S. Appl. No. 15/003,558, 5 pages.
U.S. Notice of Allowance dated Jul. 18, 2017 from related U.S. Appl. No. 15/003,634, 6 pages.
U.S. Notice of Allowance dated Jul. 24, 2017 from related U.S. Appl. No. 15/003,088, 12 pages.
U.S. Notice of Allowance dated Jun. 20, 2017, from related U.S. Appl. No. 15/204,675, 9 pages.
U.S. Notice of Allowance dated Jun. 28, 2017 from related U.S. Appl. No. 15/003,256, 10 pages.
U.S. Office Action dated Aug. 15, 2017 from related U.S. Appl. No. 15/003,281, 12 pages.
U.S. Office Action dated Jul. 27, 2017 from related U.S. Appl. No. 15/003,577, 15 pages.
U.S. Office Action dated Jun. 1, 2017, from related U.S. Appl. No. 15/003,797, 29 pages.
U.S. Office Action dated Jun. 1, 2017, from related U.S. Appl. No. 15/179,957, 29 pages.
U.S. Office Action dated Jun. 12, 2017, from related U.S. Appl. No. 15/003,256, 9 pages.
U.S. Office Action dated Jun. 12, 2017, from related U.S. Appl. No. 15/003,336, 14 pages.
U.S. Office Action dated Jun. 16, 2017, from related U.S. Appl. No. 15/003,678, 15 pages.
U.S. Office Action dated Jun. 2, 2017, from related U.S. Appl. No. 15/476,636, 10 pages.
Wroble, "Performance Analysis of Magnetic Indoor Local Positioning System." Western Michigan University Master's Theses, Paper 609 (Jun. 2015), 42 pages.
U.S. Appl. No. 15/446,373, filed Mar. 1, 2017.
U.S. Appl. No. 15/450,504, filed Mar. 6, 2017.
U.S. Appl. No. 15/454,162, filed Mar. 9, 2017.
U.S. Appl. No. 15/456,913, filed Mar. 13, 2017.
U.S. Appl. No. 15/468,356, filed Mar. 24, 2017.
U.S. Appl. No. 15/468,397, filed Mar. 24, 2017.
U.S. Appl. No. 15/468,386, filed Mar. 24, 2017.
U.S. Appl. No. 15/468,289, filed Mar. 24, 2017.
U.S. Appl. No. 15/468,641. filed Mar. 24, 2017.
U.S. Appl. No. 15/468,582, filed Mar. 24, 2017.
U.S. Appl. No. 15/468,410, filed Mar. 24, 2017.
U.S. Appl. No. 15/468,951, filed Mar. 24, 2017.
U.S. Appl. No. 15/468,559, filed Mar. 24, 2017.
U.S. Appl. No. 15/468,282, filed Mar. 24, 2017.
U.S. Appl. No. 15/468,314, filed Mar. 24, 2017.
U.S. Appl. No. 15/468,274, filed Mar. 24, 2017.
U.S. Appl. No. 15/468,303, filed Mar. 24, 2017.
U.S. Appl. No. 15/469,374, filed Mar. 24, 2017.
U.S. Appl. No. 15/476,636, filed Mar. 31, 2017.
U.S. Appl. No. 15/479,256, filed Apr. 4, 2017.
Bui et al., "Noninvasive Fault Monitoring of Electrical Machines by Solving the Steady-State Magnetic Inverse Problem," in IEEE Transactions on Magnetics, vol. 44, No. 6, pp. 1050-1053, Jun. 24, 2008.
Chadebec et al., "Rotor fault detection of electrical machines by low frequency magnetic stray field analysis," 2005 5th IEEE International Symposium on Diagnostics for Electric Machines, Power Electronics and Drives, Vienna, 2005, submitted Mar. 22, 2006, pp. 1-6.
Froidurot et al., "Magnetic discretion of naval propulsion machines," in IEEE Transactions on Magnetics, vol. 38, No. 2, pp. 1185-1188, Mar. 2002.
IEEE Std 802.11 TM-2012 Wireless Lan Medium Access Control (MAC) and Physical Layer (PHY) Specifications, 1 page.
Kwon et al., "Analysis of the far field of permanent-magnet motors and effects of geometric asymmetries and unbalance in magnet design," in IEEE Transactions on Magnetics, vol. 40, No. 2, pp. 435-442, Mar. 2004.
Maertz et al., "Vector magnetic field microscopy using nitrogen vacancy centers in diamond", Applied Physics Letters 96, No. 9, Mar. 1, 2010, pp. 092504-1-092504-3.
U.S. Notice of Allowance dated Feb. 21, 2018, from related U.S. Appl. No. 15/003,176, 9 pages.
U.S. Office Action dated Feb. 1, 2018, from related U.S. Appl. No. 15/003,577, 16 pages.
U.S. Office Action dated Feb. 5, 2018, from related U.S. Appl. No. 15/450,504, 12 pages.
U.S. Office Action dated Jan. 25, 2018, from related U.S. Appl. No. 15/672,953, 28 pages.
U.S. Office Action dated Jan. 26, 2018, from related U.S. Appl. No. 15/003,678, 14 pages.
U.S. Office Action dated Mar. 27, 2018, from related U.S. Appl. No. 15/468,386, 21 pages.
U.S. Office Action dated Mar. 28, 2018, from related U.S. Appl. No. 15/003,177, 12 pages.
U.S. Office Action dated Mar. 5, 2018, from related U.S. Appl. No. 14/866,730, 14 pages.
U.S. Office Action dated Mar. 8, 2018, from related U.S. Appl. No. 15/380,691, 12 pages.
U.S. Office Action dated Mar. 8, 2018, from related U.S. Appl. No. 15/479,256, 30 pages.
Wegerich, "Similarity based modeling of time synchronous averaged vibration signals for machinery health monitoring," 2004 IEEE Aerospace Conference Proceedings (IEEE Cat. No. 04TH8720), 2004, pp. 3654-3662 vol. 6.
Wikipedia, "Continuous phase modulation", downloaded from https://web.archive.org/web/20151017015236/https://en.wikipedia.org/wiki/Continuous_phase_modulation on May 10, 2017, 3 pages.
Wikipedia, "Minimum-shift keying", downloaded from https://web.archive.org/web/20151017175828/https://en.wikipedia.org/wiki/Minimum-shift_keying on May 10, 2017, 2 pages.

* cited by examiner

MAGNETOMETER WITH A LIGHT EMITTING DIODE

CROSS-REFERENCE TO RELATED APPLICATIONS

The present application is related to co-pending U.S. application Ser. No. 15/003,281, filed Jan. 21, 2016, titled "MAGNETOMETER WITH LIGHT PIPE," U.S. application Ser. No. 15/003,298, filed Jan. 21, 2016, titled "DIAMOND NITROGEN VACANCY SENSOR WITH COMMON RF AND MAGNETIC FIELDS GENERATOR," U.S. application Ser. No. 15/003,309, filed Jan. 21, 2016, titled "DIAMOND NITROGEN VACANCY SENSOR WITH DUAL RF SOURCES," which issued as U.S. Pat. No. 9,551,763 on Jan. 24, 2017, U.S. application Ser. No. 15/003,062, filed Jan. 21, 2016, titled "IMPROVED LIGHT COLLECTION FROM DNV SENSORS," each of which is incorporated by reference herein in its entirety.

TECHNICAL FIELD

The present disclosure relates, in general, to nitrogen vacancy centers in diamonds. More particularly, the present disclosure relates to using LEDs to excite nitrogen vacancy centers in diamonds.

BACKGROUND

The following description is provided to assist the understanding of the reader. None of the information provided or references cited is admitted to be prior art. Some diamonds have defects in the crystal structure that contain nitrogen. A light source can be used to excite the defect. However, many such light sources are large, bulky, expensive, and/or consume relatively large amounts of power.

SUMMARY

An illustrative device includes a diamond with one or more nitrogen vacancies and a light emitting diode configured to emit light toward the diamond. The device may also include a first photo sensor configured to sense a first portion of the light emitted by the light emitting diode. The first portion of the light may not travel through the diamond. The device may further include a second photo sensor configured to sense a second portion of the light emitted by the light emitting diode. The second portion of the light may travel through the diamond. The device may also include a processor operatively coupled to the first photo sensor and a second photo sensor. The processor may be configured to compare a first signal received from the first photo sensor with a second signal received from the second photo sensor and determine, based on the comparison of the first signal and the second signal, a strength of a magnetic field applied to the diamond.

An illustrative method includes providing power to a light emitting diode. The light emitting diode may be configured to emit light toward a diamond. The diamond may comprise a nitrogen vacancy. The method may also include receiving, at a processor, a first signal from a first sensor. The first signal may indicate a strength of a frequency of a first portion of the light emitted by the light emitting diode. The first portion of the light may not travel through the diamond. The method may also include receiving, at the processor, a second signal from a second sensor. The second signal may indicate a strength of a frequency of a second portion of the light. The second portion of the light may travel through the diamond. The method may further include comparing, based on the first signal and the second signal, the strength of the frequency of the first portion of the light and the strength of the frequency of the second portion of the light to determine a strength of a magnetic field applied to the diamond.

An illustrative method includes emitting, from a light emitting diode, a first light portion and a second light portion, sensing, at a first sensor, the first light portion, and sensing, at a second sensor, the second light portion, wherein the second light portion traveled through a diamond with a nitrogen vacancy. The method may also include comparing the first light portion to the second light portion to determine a strength of a magnetic field applied to the diamond.

An illustrative method includes emitting light from a light emitting diode. The light travels through a diamond with a nitrogen vacancy. The method may further include determining, based on a signal from a photo sensor that sensed the light, a magnetic field applied to the diamond.

An illustrative method includes emitting light from a light source. The light may not be polarized. The light may travel through a diamond with nitrogen vacancies. The method may further include determining, based on a signal from a photo sensor that sensed the light, a magnetic field applied to the diamond.

An illustrative device includes a diamond with one or more nitrogen vacancies, a light emitting diode configured to emit light that travels through the diamond, and a photo sensor configured to sense the light. The device may also include a processor operatively coupled to the photo sensor. The processor may be configured to determine, based on the light sensed by the photo sensor, a magnetic field applied to the diamond.

An illustrative device includes a diamond with one or more nitrogen vacancies, a light source configured to emit light that travels through the diamond. The light may not be polarized. The device may further include a photo sensor configured to sense the light and a processor operatively coupled to the photo sensor. The processor may be configured to determine, based on the light sensed by the photo sensor, a magnetic field applied to the diamond.

The foregoing summary is illustrative only and is not intended to be in any way limiting. In addition to the illustrative aspects, embodiments, and features described above, further aspects, embodiments, and features will become apparent by reference to the following drawings and the detailed description.

Figure 1:
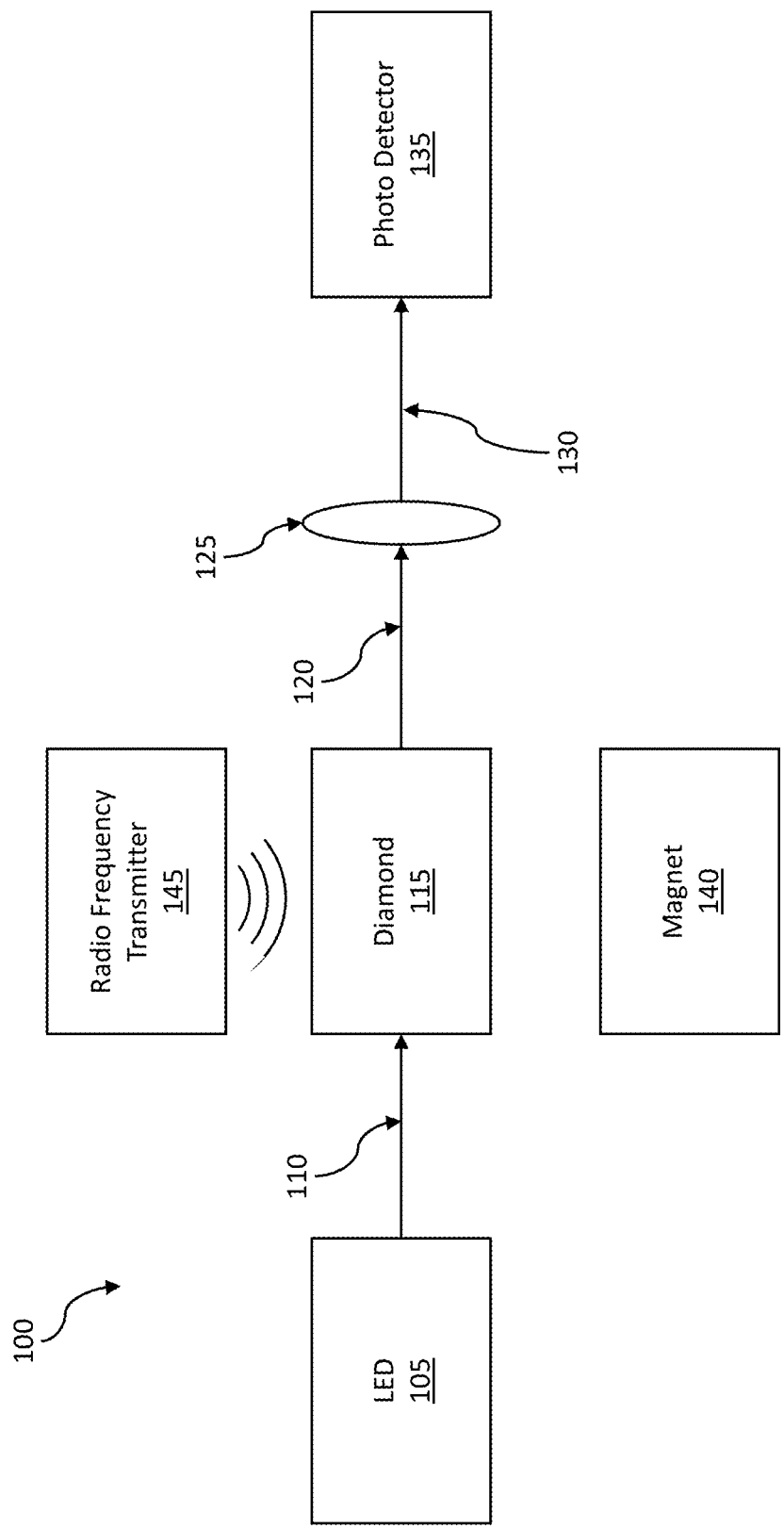
FIG. 1 is a block diagram of a magnetometer in accordance with an illustrative embodiment.

The foregoing and other features of the present disclosure will become apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

Nitrogen-vacancy centers (NV centers) are defects in a diamond's crystal structure, which can purposefully be manufactured in synthetic diamonds. In general, when excited by green light and/or microwave radiation, the NV centers cause the diamond to generate red light. When an excited NV center diamond is exposed to an external magnetic field the frequency of the microwave radiation at which the diamond generates red light and the intensity of the light change. By measuring this change and comparing it to the microwave frequency that the diamond generates red light at when not in the presence of the external magnetic field, the NV centers can be used to accurately detect the magnetic field strength.

In many instances, a light source is used to provide light to the diamond. The more light that is transmitted through the diamond, the more light can be detected and analyzed to determine the amount of red light emitted from the diamond. The amount of red light can be used to determine the strength of the magnetic field applied to the diamond. Accordingly, in some instances, lasers are used to provide light to the diamond. Lasers can provide concentrated light to the diamond and can focus the beam of light relatively easily.

However, lasers may not be the most effective light source for all applications. For example, some lasers produce polarized light. Because the axes of the NV centers may not all be oriented in the same direction, the polarized light from a laser may excite NV centers with axes oriented in one direction more effectively than NV centers with axes oriented in other directions. In instances in which sensitivity in all directions (or more than one direction) is desired, non-polarized light may be used. The non-polarized light may affect the NV centers of different orientations (more) uniformly. In such instances, a light source such as a light-emitting diode (LED) may be used as the light source. In some instances, lasers that produce non-polarized light may be used. For example, helium-neon (HeNe) lasers can be used.

Figure 6:
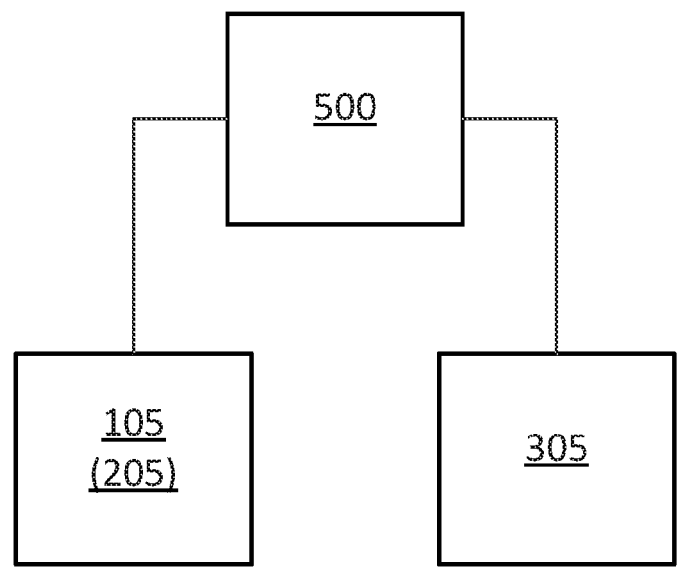
FIG. 6 is a block diagram of a battery providing power to a light emitting diode and/or a processor in accordance with an illustrative embodiment.

In some instances, lasers are relatively bulky and large compared to LEDs. In such instances, using LEDs as the light source for a magnetometer using a diamond with NV centers may provide a more compact and versatile sensor. In some instances, lasers user more power to produce light than do LEDs. In such instances, LEDs may allow a power source, such as a battery 500 (see FIG. 6), to last longer, be smaller, and/or provide less power.

FIG. 1 is a block diagram of a magnetometer in accordance with an illustrative embodiment. An illustrative magnetometer 100 includes an LED 105, source light 110, a diamond 115, red light 120, a filter 125, filtered light 130, a photo detector 135, and a radio frequency transmitter 145. In alternative embodiments, additional, fewer, and/or different elements may be used.

The LED 105 can be used to produce the source light 110. In alternative embodiments, any suitable light source can be used to produce the source light 110. For example, a light source that produces non-polarized light can be used. In embodiments in which an LED is used, any suitable LED may be used. For example, the LED 105 can emit primarily green light, primarily blue light, or any other suitable light with a wavelength shorter than red light.

In some embodiments, the LED 105 emits any suitable light, such as white light. The light can pass through one or more filters before entering the diamond 115. The filters can filter out light that is not the desired wavelength.

The source light 110 is emitted by the LED 105. The source light 110 can be any suitable light. In an illustrative embodiment, the source light 110 has a wavelength of between 500 nanometers (nm) and 600 nm. For example, the source light 110 can have a wavelength of 532 nm (e.g., green light), 550 nm, or 518 nm. In some embodiments, the source light 110 can be blue (e.g., with a wavelength as low as 450 nm). In yet other embodiments, the source light 110 can have a wavelength lower than 450 nm. In some embodiments, the source light 110 can be any color of visible light other than red.

An illustrative diamond 115 includes one or more nitrogen vacancy centers (NV centers). As explained above, each of the NV centers' axes can be oriented in one of multiple directions. In an illustrative embodiment, each of the NV centers are oriented in one of four directions. In some embodiments, the distribution of NV centers with any particular axis direction is even throughout the diamond 115. The diamond 115 can be any suitable size. In some embodiments, the diamond 115 is sized such that the source light 110 provides a relatively high light density. That is, the diamond 115 can be sized such that all or almost all of the NV centers are excited by the source light 110. In some instances, the LED 105 emits less light than a laser. In such instances, a thinner diamond can be used with the LED 105 to ensure that all or nearly all of the NV centers are excited. The diamond can be "thinner" in the direction that the source light 110 travels. Thus, the source light 110 travels a shorter distance through the diamond 115.

A magnet 140 can be used to provide a magnetic field. When the magnetic field is applied to the diamond 115 and light is traveling through the diamond 115, the NV centers can cause the amount of red light emitted from the diamond 115 to be changed. For example, when the source light 110 is pure green light and there is no magnetic field applied to the diamond 115, then the red light 120, which is emitted from the diamond 115, is used as a baseline level of red light 120. When there is a magnetic field applied to the diamond 115, such as via the magnet 140, the amount of red light 120 varies in intensity. Thus, by monitoring the amount of red light from a baseline (e.g., no magnetic field applied to the diamond 115) in the red light 120, a magnetic field applied to the diamond 115 can be measured. In some instances, the red light 120 emitted from the diamond 115 can be any suitable wavelength.

The radio frequency transmitter 145 can be used to transmit radio waves to the diamond 115. The amount of red light emitted from the diamond 115 changes based on the frequency of the radio waves absorbed by the diamond 115. Thus, by modulating the frequency of the radio waves emitted from the radio frequency transmitter 145 the amount of red light sensed by the photo detector 135 may change. By monitoring the amount of red light sensed by the photo detector 135 relative to the frequency of the radio waves emitted by the radio frequency transmitter 145, the strength of the magnetic field applied to the diamond 115 by the magnet 140 can be determined.

In an illustrative embodiment, a photo detector 135 is used to receive the light emitted from the diamond 115. The photo detector 135 can be any suitable sensor configured to analyze light emitted from the diamond 115. For example, the photo detector 135 can be used to determine the amount of red light in the red light 120.

As illustrated in FIG. 1, some embodiments include a filter 125. The filter 125 can be configured to filter the red light 120. For example, the filter 125 can be a red filter that permits red light to pass through the filter 125 but blocks some or all of non-red light from passing through the filter 125. In alternative embodiments, any suitable filter 125 can be used. In some embodiments, the filter 125 is not used. In embodiments that include the filter 125, the red light 120 emitted from the diamond 115 passes through the filter 125, and the filtered light 130 (which is emitted from the filter 125) travels to the photo detector 135. In embodiments in which a filter 125 is used, greater sensitivity may be achieved because the photo detector 135 detects only the light of interest (e.g., red light) and other light (e.g., green light, blue light, etc.) does not affect the sensitivity of the photo detector 135.

Figure 2:
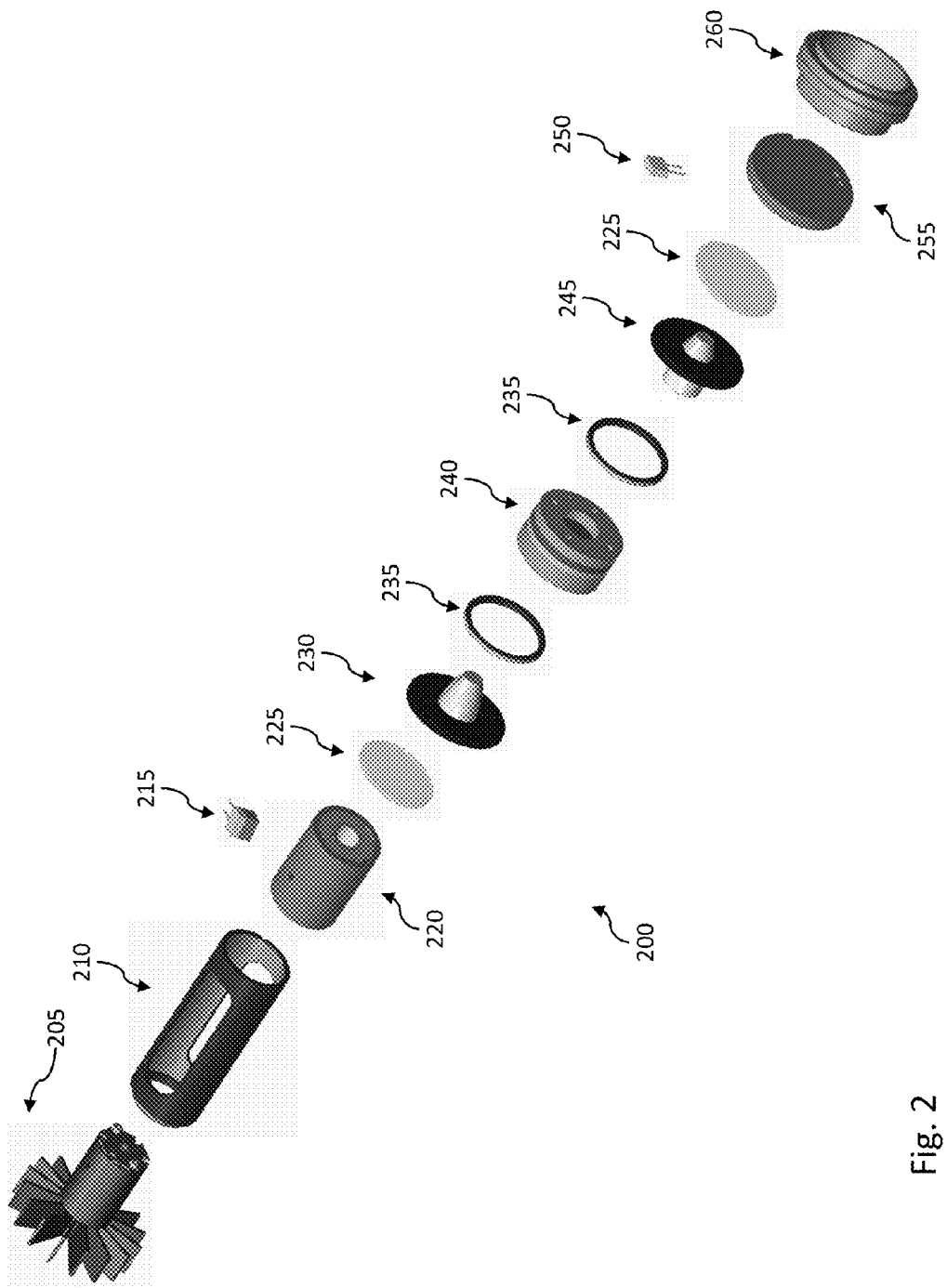
FIG. 2 is an exploded view of a magnetometer in accordance with an illustrative embodiment.

FIG. 2 is an exploded view of a magnetometer in accordance with an illustrative embodiment. An illustrative magnetometer 200 includes an LED 205, a housing 210, a source light photo sensor 215, a mirror tube assembly 220, electromagnetic glass 225, a concentrator 230, retaining rings 235, a diamond assembly 240, a concentrator 245, a modulated light photo sensor 250, a sensor plate 255, and a lens tube coupler 260. In alternative embodiments, additional, fewer, and/or different elements may be used. Additionally, the embodiment illustrated in FIG. 2 is meant to be illustrative only and not meant to be limiting with respect to the orientation, size, or location of elements.

Figure 5:
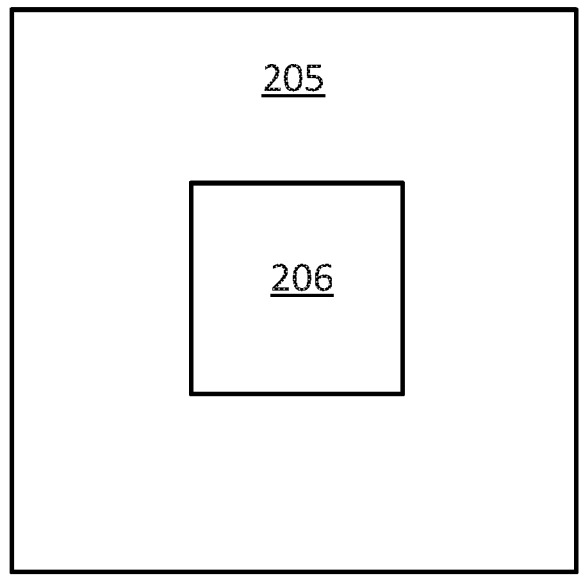
FIG. 5 is a block diagram of a light emitting diode including a heat sink in accordance with an illustrative embodiment.

An illustrative LED 205 includes a heat sink 206 (see FIG. 5) that is configured to dissipate into the environment heat created by the LED 205. In the embodiment illustrated in FIG. 2, at least a portion of the LED 205 (e.g., a cylindrical portion) fits within the housing 210. Adjacent to the LED 205 within the housing 210 is the mirror tube assembly 220. The mirror tube assembly 220 is configured to focus the light from the LED 205 into a concentrated beam.

The source light photo sensor 215 is configured to receive a portion of the light emitted from the LED 205. In some embodiments, the source light photo sensor 215 can include a green filter. In such embodiments, the source light photo sensor 215 receives mostly or all green light. In embodiments in which the source light photo sensor 215 is used, the amount of green light sensed by the source light photo sensor 215 can be compared to the amount of red light sensed by the modulated photo sensor 250 to determine the magnitude of the magnetic field applied to the diamond assembly 240. As discussed above, in some embodiments, the source light photo sensor 215 may not be used. In such embodiments, the amount of red light sensed by the modulated photo sensor 250 can be compared to a baseline amount of red light to determine the magnitude of the magnetic field applied to the diamond assembly 240.

In some embodiments, such as those that use the source light photo sensor 215, electromagnetic glass 225 can be located between the source light photo sensor 215 and the diamond assembly 240. In some embodiments, the diamond assembly 240 can emit electromagnetic interference (EMI) signals. In some instances, the source light photo sensor 215 can be sensitive to EMI signals. That is, in such instances, the source light photo sensor 215 performs better when there is less EMI affecting the source light photo sensor 215. The electromagnetic glass 225 can allow light to pass through the electromagnetic glass 225, but inhibit transmission of electromagnetic signals. Any suitable electromagnetic glass 225 can be used. In alternative embodiments, any suitable EMI attenuator can be used.

The concentrator 230 can be configured to concentrate light from the mirror tube assembly 220 (and/or the electromagnetic glass 225) into a more narrow beam of light. The concentrator 230 can be any suitable shape, such as parabolic. The diamond assembly 240 can include a diamond with one or more NV centers. The concentrator 230 can concentrate light from the LED 205 into a beam of light with a cross-sectional area that is similar to the cross-sectional area of the diamond. That is, the light from the LED 205 can be concentrated to most effectively flood the diamond with the light such that as much of the light as possible from the LED 205 passes through the diamond and/or such that as many NV centers as possible are excited by the light. The concentrator 230 may include a ring mount that is configured to hold the concentrator 230 at a secure location within the housing 210.

Figure 7:
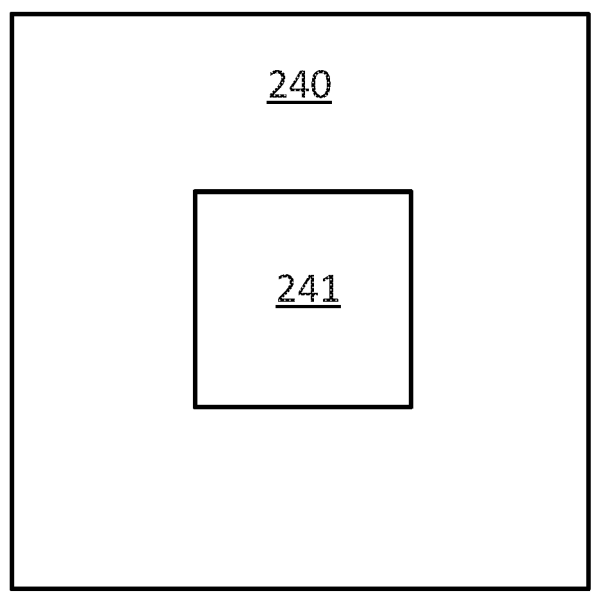
FIG. 7 is a block diagram of a diamond assembly including a three-dimensional Helmholtz coil in accordance with an illustrative embodiment.

The diamond assembly 240 can include any suitable components. For example, as mentioned above, the diamond assembly 240 can include a diamond. The diamond can be located at the center of the diamond assembly 240. The diamond assembly 240 may also include one or more circuit boards that are configured to modulate electromagnetic signals applied to the diamond. In an illustrative embodiment, the diamond assembly 240 includes a Helmholtz coil 241 (see FIG. 7). For example, a three-dimensional Helmholtz coil 241 can be used counteract or cancel unwanted magnetic fields from affecting the diamond. In an illustrative embodiment, the circuit boards or other electronics can emit EMI signals. In some embodiments, the diamond assembly 240 includes a red filter that allows red light emitted from the diamond to pass through to the modulated photo sensor 250. In alternative embodiments, the red filter can be located at any suitable location between the diamond and the modulated photo sensor 250. In yet other embodiments, the red filter may not be used.

In some embodiments, the retaining rings 235 can be used to hold one or more of the elements of the magnetometer 200 within the housing 210. Although FIG. 2 illustrates two retaining rings 235, any suitable number of retaining rings 235 may be used. In some embodiments, the retaining rings 235 may not be used.

Similar to the concentrator 230, the concentrator 245 is configured to concentrate light emitted from the diamond assembly 240 into a more narrow beam. For example, the concentrator 230 can be configured to concentrate light into a beam that has the same or a similar cross-sectional area as the modulated photo sensor 250. The concentrator 245 can be configured to focus as much light as possible from the diamond assembly 240 to the modulated photo sensor 250. By increasing the amount of light emitted from the diamond assembly 240 that is sensed by the modulated photo sensor 250, the sensitivity of the magnetometer 200 can be increased.

As mentioned above, electromagnetic glass 225 can be located between the diamond assembly 240 and the modulated photo sensor 250 to shield the modulated photo sensor 250 from EMI signals emitted from the diamond assembly 240. The sensor plate 255 can be used to hold the modulated photo sensor 250 in place such that the modulated photo sensor 250 receives the concentrated light beam from the concentrator 245 (and/or the diamond assembly 240). A lens tube coupler 260 may be used as an end cap to the housing 210, thereby holding the various elements in place inside the housing 210.

Figure 3:
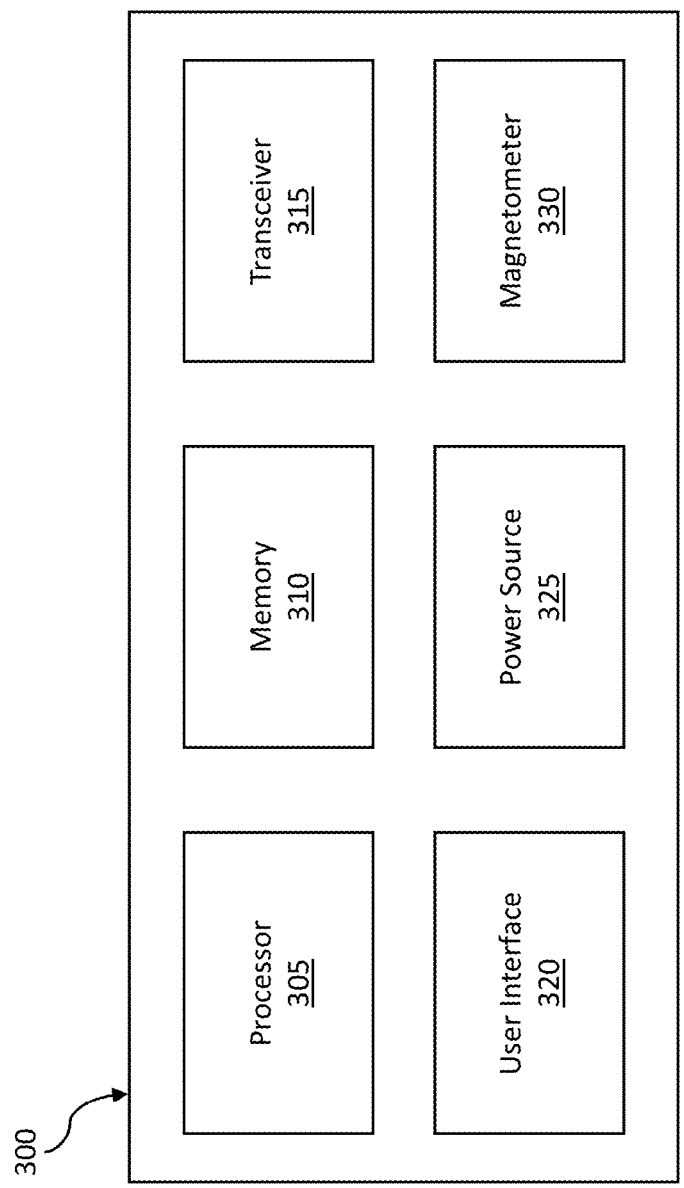
FIG. 3 is a block diagram of a computing device in accordance with an illustrative embodiment.

FIG. 3 is a block diagram of a computing device in accordance with an illustrative embodiment. An illustrative computing device 300 includes a memory 310, a processor 305, a transceiver 315, a user interface 320, a power source 325, and an magnetometer 330. In alternative embodiments, additional, fewer, and/or different elements may be used. The computing device 300 can be any suitable device described herein. For example, the computing device 300 can be a desktop computer, a laptop computer, a smartphone, a specialized computing device, etc. The computing device 300 can be used to implement one or more of the methods described herein.

In an illustrative embodiment, the memory 310 is an electronic holding place or storage for information so that the information can be accessed by the processor 305. The memory 310 can include, but is not limited to, any type of random access memory (RAM), any type of read only memory (ROM), any type of flash memory, etc. such as magnetic storage devices (e.g., hard disk, floppy disk, magnetic strips, etc.), optical disks (e.g., compact disk (CD), digital versatile disk (DVD), etc.), smart cards, flash memory devices, etc. The computing device 300 may have one or more computer-readable media that use the same or a different memory media technology. The computing device 300 may have one or more drives that support the loading of a memory medium such as a CD, a DVD, a flash memory card, etc.

In an illustrative embodiment, the processor 305 executes instructions. The instructions may be carried out by a special purpose computer, logic circuits, or hardware circuits. The processor 305 may be implemented in hardware, firmware, software, or any combination thereof. The term "execution" is, for example, the process of running an application or the carrying out of the operation called for by an instruction. The instructions may be written using one or more programming language, scripting language, assembly language, etc. The processor 305 executes an instruction, meaning that it performs the operations called for by that instruction. The processor 305 operably couples with the user interface 320, the transceiver 315, the memory 310, etc. to receive, to send, and to process information and to control the operations of the computing device 300. The processor 305 may retrieve a set of instructions from a permanent memory device such as a ROM device and copy the instructions in an executable form to a temporary memory device that is generally some form of RAM. An illustrative computing device 300 may include a plurality of processors that use the same or a different processing technology. In an illustrative embodiment, the instructions may be stored in memory 310. The processor 305 may be powered by a battery such as the battery 500 (see FIG. 6).

In an illustrative embodiment, the transceiver 315 is configured to receive and/or transmit information. In some embodiments, the transceiver 315 communicates information via a wired connection, such as an Ethernet connection, one or more twisted pair wires, coaxial cables, fiber optic cables, etc. In some embodiments, the transceiver 315 communicates information via a wireless connection using microwaves, infrared waves, radio waves, spread spectrum technologies, satellites, etc. The transceiver 315 can be configured to communicate with another device using cellular networks, local area networks, wide area networks, the Internet, etc. In some embodiments, one or more of the elements of the computing device 300 communicate via wired or wireless communications. In some embodiments, the transceiver 315 provides an interface for presenting information from the computing device 300 to external systems, users, or memory. For example, the transceiver 315 may include an interface to a display, a printer, a speaker, etc. In an illustrative embodiment, the transceiver 315 may also include alarm/indicator lights, a network interface, a disk drive, a computer memory device, etc. In an illustrative embodiment, the transceiver 315 can receive information from external systems, users, memory, etc.

In an illustrative embodiment, the user interface 320 is configured to receive and/or provide information from/to a user. The user interface 320 can be any suitable user interface. The user interface 320 can be an interface for receiving user input and/or machine instructions for entry into the computing device 300. The user interface 320 may use various input technologies including, but not limited to, a keyboard, a stylus and/or touch screen, a mouse, a track ball, a keypad, a microphone, voice recognition, motion recognition, disk drives, remote controllers, input ports, one or more buttons, dials, joysticks, etc. to allow an external source, such as a user, to enter information into the computing device 300. The user interface 320 can be used to navigate menus, adjust options, adjust settings, adjust display, etc.

The user interface 320 can be configured to provide an interface for presenting information from the computing device 300 to external systems, users, memory, etc. For example, the user interface 320 can include an interface for a display, a printer, a speaker, alarm/indicator lights, a network interface, a disk drive, a computer memory device, etc. The user interface 320 can include a color display, a cathode-ray tube (CRT), a liquid crystal display (LCD), a plasma display, an organic light-emitting diode (OLED) display, etc.

In an illustrative embodiment, the power source 325 is configured to provide electrical power to one or more elements of the computing device 300. In some embodiments, the power source 325 includes an alternating power source, such as available line voltage (e.g., 120 Volts alternating current at 60 Hertz in the United States). The power source 325 can include one or more transformers, rectifiers, etc. to convert electrical power into power useable by the one or more elements of the computing device 300, such as 1.5 Volts, 8 Volts, 12 Volts, 24 Volts, etc. The power source 325 can include one or more batteries.

In an illustrative embodiment, the computing device 300 includes a magnetometer 330. In some embodiments, magnetometer 330 is an independent device and is not integrated into the computing device 300. The magnetometer 330 can be configured to measure magnetic fields. For example, the magnetometer 330 can be the magnetometer 100, the magnetometer 200, or any suitable magnetometer. The magnetometer 330 can communicate with one or more of the other components of the computing device 300 such as the processor 305, the memory 310, etc. For example, one or more photo detectors of the magnetometer 330 can transmit a signal to the processor 305 indicating an amount of light detected by the respective photo detector. The signal can be used to determine the strength and/or direction of the magnetic field applied to the diamond of the magnetometer 330. In alternative embodiments, any suitable component of the magnetometer 330 can transmit a signal to other components of the 300 (e.g., the processor 305), such as a Helmholtz coil, a source light photo detector, one or more modulated light photo detectors, a light source, etc.

Figure 4:
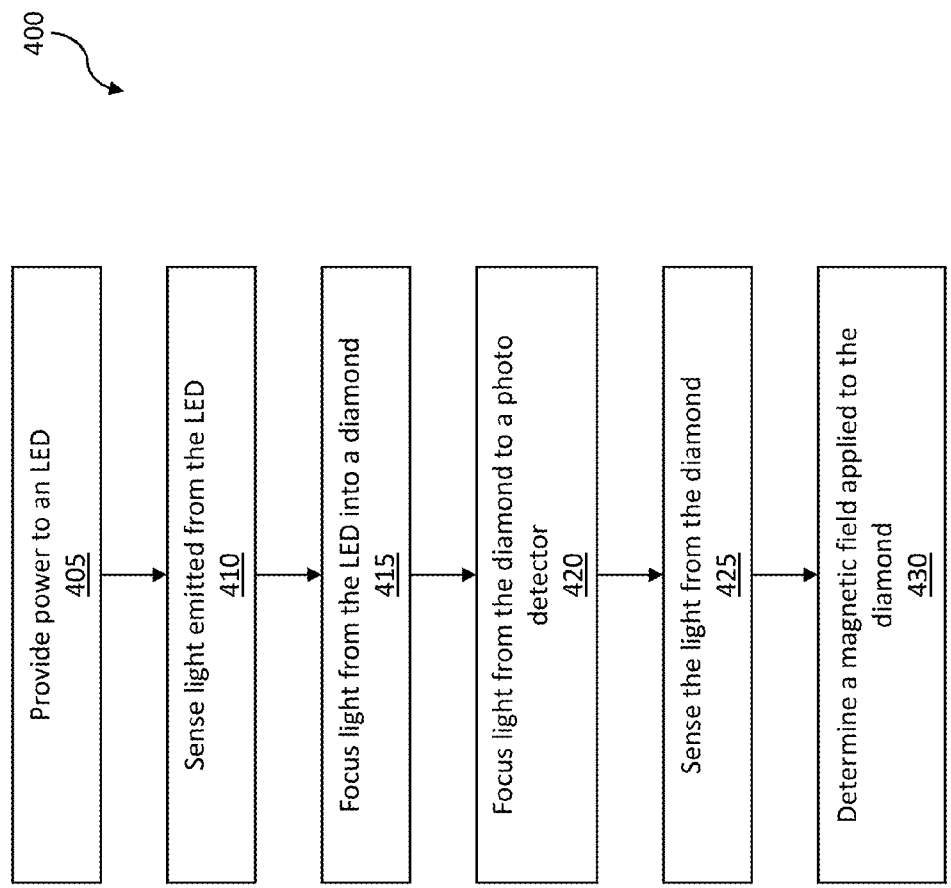
FIG. 4 is a flow diagram of a method for detecting a magnetic field in accordance with an illustrative embodiment.

FIG. 4 is a flow diagram of a method for detecting a magnetic field in accordance with an illustrative embodiment. In alternative embodiments, additional, fewer, and/or different operations may be performed. Also, the use of a flow diagram and arrows is not meant to be limiting with respect to the order or flow of operations. For example, in some embodiments, one or more of the operations may be performed simultaneously.

In an operation 405, power is provided to a light emitting diode (LED). Any suitable amount of power can be provided. For example, a 5 milli-Watt (mW) LED can be used. The LED can be powered by two or more AA batteries. In alternative embodiments, the LED can use more or less power. In some embodiments, the amount of power provided to the LED is modulated based on a particular application. In some embodiments, the operation 205 includes providing pulsed power to the LED to cause the LED to alternately lighten and darken. In such embodiments, any suitable frequency and/or pattern can be used. In alternative embodiments, the operation 405 can include causing any suitable device to emit non-polarized light.

In an operation 410, light emitted from the LED is sensed. Sensing the light from the LED can include using a photo detector. The operation 410 can include determining an amount of green light emitted from the LED. In some embodiments, the operation 410 is not performed.

In an operation 415, light from the LED is focused into a diamond. The diamond can include one or more NV centers. The light can be focused as to excite as many of the NV centers as possible with the light from the LED. Any suitable focusing method can be used. For example, lenses or light pipes can be used to focus light from the LED to the diamond.

In an operation 420, light from the diamond is focused to a photo detector. Light from the LED passes through the diamond, is modulated by the diamond, and is emitted from the diamond. The light emitted from the diamond is focused to a detector such that as much light emitted from the diamond as possible is detected by the photo detector. In an operation 425, the light from the diamond is sensed by the photo detector. In an illustrative embodiment, the operation 425 includes determining the amount of red light emitted from the diamond.

In an operation 430, a magnetic field applied to the diamond is determined. In embodiments in which operation 410 is performed, the amount of red light emitted by the diamond is compared to the amount of green light emitted from the LED to determine the magnetic field. In embodiments, in which operation 410 is not performed, the amount of red light emitted from the diamond is compared to a baseline quantity of red light. In alternative embodiments, any suitable method of determining the magnetic field applied to the diamond can be used.

In an illustrative embodiment, noise in the light emitted from the LED can be compensated for. In such an embodiment, noise in the light emitted from the LED can be detected by a photo detector, such as the photo detector used for the operation 410. Noise in the light emitted from the LED passes through the diamond and is sensed by the photo detector that senses light emitted from the diamond, such as the photo detector used for the operation 425. In an illustrative embodiment, amount of light detected in the operation 410 is subtracted from the light detected in the operation 430. The result of the subtraction is the changes in the light caused by the diamond.

In an illustrative embodiment, any of the operations described herein can be implemented at least in part as computer-readable instructions stored on a computer-readable memory. Upon execution of the computer-readable instructions by a processor, the computer-readable instructions can cause a node to perform the operations.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A device comprising:
    a diamond assembly including a diamond with one or more nitrogen vacancies;
    a light emitting diode configured to emit light toward the diamond;
    a first photo sensor configured to sense a first portion of the light emitted by the light emitting diode, wherein the first portion of the light does not travel through the diamond;
    a second photo sensor configured to sense a second portion of the light emitted by the light emitting diode, wherein the second portion of the light travels through the diamond; and a processor operatively coupled to the first photo sensor and a second photo sensor, wherein the processor is configured to:
        compare a first signal received from the first photo sensor with a second signal received from the second photo sensor; and
        determine, based on the comparison of the first signal and the second signal, a strength of a magnetic field applied to the diamond.

2. The device of claim 1, further comprising a first filter between the light emitting diode and the first photo sensor, wherein light traveling through the first filter and to the first photo sensor is substantially green.

3. The device of claim 1, further comprising a second filter between the diamond and the second photo sensor, wherein light traveling through the second filter and to the second photo sensor is substantially red.

4. The device of claim 1, further comprising a heat sink configured to dissipate heat created by the light emitting diode.

5. The device of claim 1, further comprising a battery configured to provide power to the light emitting diode and the processor.

6. The device of claim 1, further comprising a sensor plate, wherein the second photo sensor is disposed on the sensor plate.

7. The device of claim 1, wherein the light emitted from the light emitting diode is substantially green.

8. The device of claim 1, further comprising:
    a first electromagnetic glass positioned between the first photo sensor and the diamond assembly, wherein the first electromagnetic glass is configured to shield the first photo sensor from first electromagnetic interference emitted by the diamond assembly; and
    a second electromagnetic glass positioned between the diamond assembly and the second photo sensor, wherein the second electromagnetic glass is configured to shield the second photo sensor from second electromagnetic interference emitted by the diamond assembly.

9. The device of claim 1, wherein the first photo sensor is configured to detect noise in the light emitted from the light emitting diode, and wherein the processor is further configured to compensate for noise in the second portion of the light based on the detected noise in the light emitted from the light emitting diode.

10. The device of claim 1, further comprising a three-dimensional Helmholtz coil surrounding the diamond.

11. A method comprising:
    emitting light from a light emitting diode;
    sensing, at a first sensor, a first light portion, the first light portion being a portion of the light emitted by the light emitting diode that has not traveled through a diamond with a nitrogen vacancy;
    sensing, at a second sensor, a second light portion, the second light portion being a portion of the light emitted by the light emitting diode that has traveled through the diamond with the nitrogen vacancy; and
    comparing the first light portion to the second light portion to determine a strength of a magnetic field applied to the diamond.

12. The method of claim 11, wherein said comparing the first light portion to the second light portion comprises comparing a strength of the first light portion to a strength of the second light portion.

13. The method of claim 11, wherein a frequency of the first light portion is a green color, and wherein a frequency of the second light portion is a red color.

* * * * *